United States Patent
Kim et al.

(10) Patent No.: US 12,349,516 B2
(45) Date of Patent: Jul. 1, 2025

(54) DISPLAY DEVICE AND METHOD OF FABRICATING THE SAME

(71) Applicant: Samsung Display Co., LTD., Yongin-si (KR)

(72) Inventors: Jin Wan Kim, Hwaseong-si (KR); Sang Jo Kim, Daejeon (KR); Hoo Keun Park, Yongin-si (KR); Byung Ju Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 476 days.

(21) Appl. No.: 17/855,182

(22) Filed: Jun. 30, 2022

(65) Prior Publication Data

US 2023/0111615 A1     Apr. 13, 2023

(30) Foreign Application Priority Data

Oct. 13, 2021   (KR) ........................ 10-2021-0135762

(51) Int. Cl.
| | | |
|---|---|---|
| *H10H 20/831* | (2025.01) | |
| *H10D 86/40* | (2025.01) | |
| *H10H 20/01* | (2025.01) | |
| *H10H 20/81* | (2025.01) | |
| *H10H 20/816* | (2025.01) | |
| *H10H 20/817* | (2025.01) | |
| *H10H 20/825* | (2025.01) | |
| *H10H 20/832* | (2025.01) | |
| *H10H 29/14* | (2025.01) | |

(52) U.S. Cl.
CPC ........ *H10H 20/8312* (2025.01); *H10H 20/01* (2025.01); *H10H 20/8162* (2025.01); *H10H 20/825* (2025.01); *H10H 29/142* (2025.01); *H10H 20/032* (2025.01)

(58) Field of Classification Search
CPC .... H10H 20/832; H10H 20/83; H10H 20/825; H10H 20/813; H10H 20/857; H10H 20/0364; H10H 20/8312; H10H 20/821; H10H 29/142; H10H 20/01; H10H 20/8162; H10H 20/817; H10H 20/81; H10D 86/40
See application file for complete search history.

(56) References Cited

U.S. PATENT DOCUMENTS

| | | | |
|---|---|---|---|
| 11,621,253 B2* | 4/2023 | Chae | ................... H01L 25/0756 257/88 |
| 2012/0049236 A1* | 3/2012 | Kamiya | ............. H10H 20/8312 257/E33.063 |
| 2021/0057601 A1 | 2/2021 | Oliver et al. | |

FOREIGN PATENT DOCUMENTS

KR    10-2013-0007557 A    1/2013

* cited by examiner

*Primary Examiner* — Sonya McCall-Shepard
(74) *Attorney, Agent, or Firm* — Womble Bond Dickinson (US) LLP

(57) ABSTRACT

A display device is provided. The display device comprises a plurality of pixel electrodes on a first substrate and spaced apart from each other; a plurality of light emitting elements on the plurality of pixel electrodes; and a common electrode layer on the plurality of light emitting elements, wherein the common electrode layer includes a first common electrode layer on the plurality of light emitting elements, and a second common electrode layer between the first common electrode layer and the plurality of light emitting elements, and a lattice constant of the first common electrode layer is larger than a lattice constant of the second common electrode layer.

15 Claims, 30 Drawing Sheets

FIG. 2
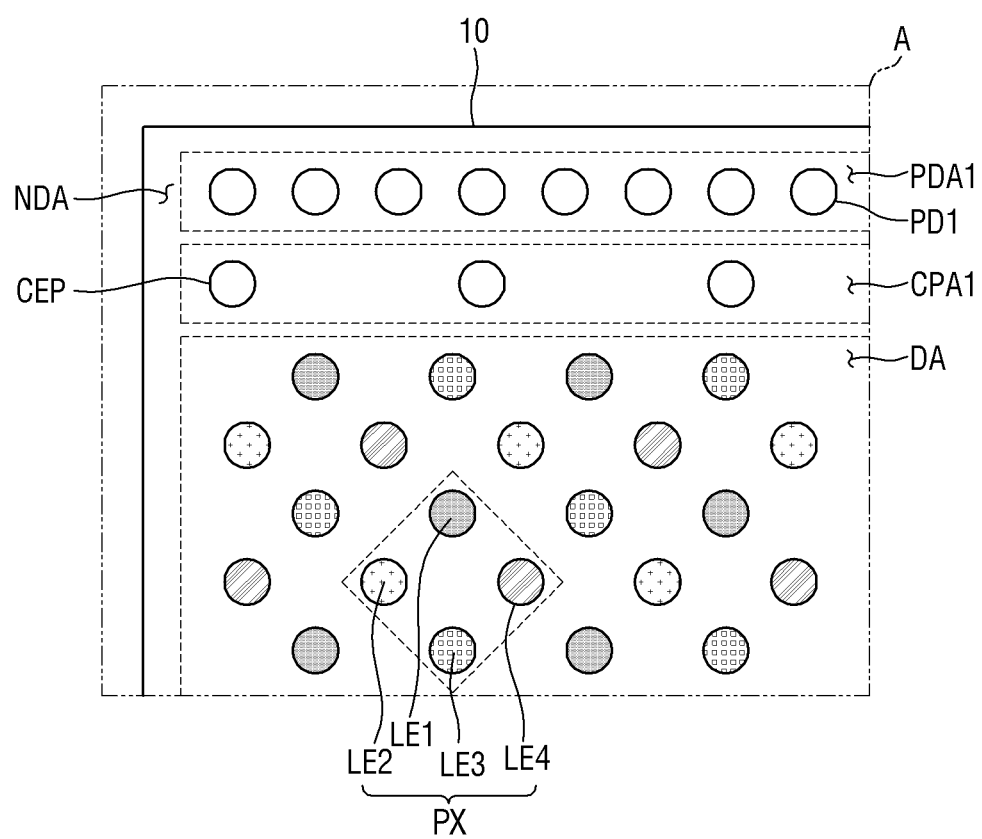
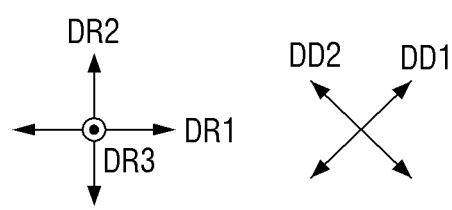

DISPLAY DEVICE AND METHOD OF FABRICATING THE SAME

CROSS-REFERENCE TO RELATED APPLICATION

This application claims priority to and the benefit of Korean Patent Application No. 10-2021-0135762 filed on Oct. 13, 2021 in the Korean Intellectual Property Office, the entire content of which is incorporated herein by reference.

BACKGROUND

1. Field

One or more embodiments of the present disclosure relate to a display device.

2. Description of the Related Art

As information society continues to develop, the demand for a display device (for displaying an image) in various forms is increasing. The display device may be a flat display device, such as, for example, a liquid crystal display device, a field emission display device, a light emitting display device, and/or the like. A light emitting display device may include an organic light emitting display device including an organic light emitting diode element as a light emitting element, an inorganic light emitting display device including an inorganic semiconductor element as a light emitting element, and/or an ultra-small light emitting diode element (or micro light emitting diode element) as a light emitting element.

Recently, a head mounted display including a light emitting display device has been developed. The head mounted display (HMD) is a glasses-type (glasses-like) monitor device for displaying virtual reality (VR) and/or augmented reality (AR) images, which is worn in a form of glasses or a helmet to form a focus point at a distance close to user's eyes. A high-resolution ultra-small light emitting diode display panel including a micro light emitting diode element may be applied to the head mounted display.

SUMMARY

One or more embodiments of the present disclosure are directed to providing a display device of which defects are improved when a light emitting element is grown.

The present disclosure is directed to providing a method of fabricating a display device of which defects are improved when a light emitting element is grown.

Embodiments of the present disclosure and effects thereof are not limited to the above-mentioned embodiments, and other embodiments which are not mentioned should be clearly understood from the following descriptions by those skilled in the art.

According to one or more embodiments of the present disclosure, there is provided a display device, a display device comprises a plurality of pixel electrodes on a first substrate and spaced apart from each other; a plurality of light emitting elements on the plurality of pixel electrodes; and a common electrode layer on the plurality of light emitting elements, wherein the common electrode layer includes a first common electrode layer on the plurality of light emitting elements, and a second common electrode layer between the first common electrode layer and the plurality of light emitting elements, and a lattice constant of the first common electrode layer is larger than a lattice constant of the second common electrode layer.

According to one or more other embodiments of the present disclosure, there is provided a method of fabricating a display device, the method including forming an undoped semiconductor layer on a semiconductor substrate; forming a common electrode layer including an n-type semiconductor on the undoped semiconductor layer; forming an insulating layer on the common electrode layer, and forming openings passing through the insulating layer and to expose the common electrode layer; forming light emitting elements in the openings, each light emitting element including an n-type semiconductor layer, an active layer, and a p-type semiconductor layer; and provided the light emitting elements on a semiconductor circuit substrate on which a plurality of pixel electrodes are provided, wherein the undoped semiconductor layer includes a first undoped semiconductor layer between the common electrode layer and the semiconductor substrate, and a second undoped semiconductor layer between the first undoped semiconductor layer and the common electrode layer, and a lattice constant of the first undoped semiconductor layer and a lattice constant of the second undoped semiconductor layer are different from each other.

BRIEF DESCRIPTION OF THE DRAWINGS

The above and other aspects and features of the present disclosure will become more apparent by describing in more detail embodiments thereof with reference to the attached drawings, in which:

FIG. 2 is an enlarged plan view illustrating one example of region A in FIG. 1;

DETAILED DESCRIPTION

Figure 1:
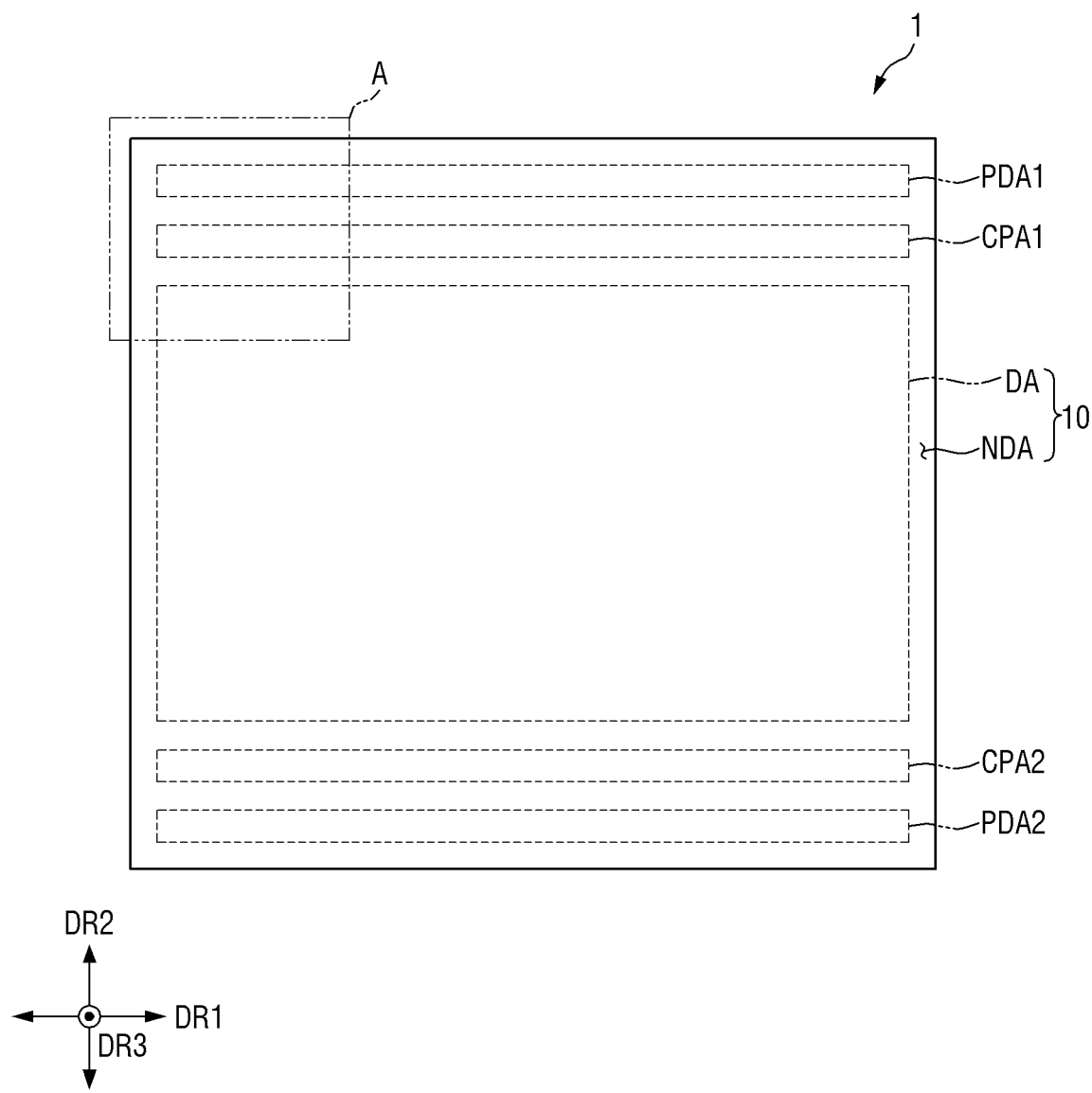
FIG. 1 is a plan view of a display device according to one or more embodiments.

Specific structural and functional descriptions of embodiments of the present disclosure disclosed herein are only provided for illustrative purposes of the embodiments of the present disclosure. The present disclosure may be embodied in many different forms without departing from the spirit and significant characteristics of the present disclosure. Therefore, the embodiments of the present disclosure are disclosed only for illustrative purposes and should not be construed as limiting the present disclosure. That is, the present disclosure is only defined by the scope of the appended claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification and drawings, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section, without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Further, the use of "may" when describing embodiments of the present disclosure refers to "one or more embodiments of the present disclosure."

As used herein, expressions such as "at least one of", "one of", and "selected from," when preceding a list of elements, modify the entire list of elements and do not modify the individual elements of the list. For example, "at least one of a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The device and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the attached drawings.

FIG. 1 is a plan view of a display device according to one or more embodiments, and FIG. 2 is an enlarged plan view illustrating one example of region A in FIG. 1.

In FIGS. 1 and 2, a case in which a display device 1 according to one or more embodiments is an ultra-small light emitting diode display device (micro or nano light emitting diode display device) including an ultra-small light emitting diode (micro or nano light emitting diode) as a light emitting element LE is mainly described, but the embodiments of the present disclosure are not limited thereto.

Further, in FIGS. 1 and 2, a first direction DR1 indicates a lateral direction of a display panel 10, a second direction DR2 indicates a vertical direction of the display panel 10, and a third direction DR3 indicates a thickness direction of the display panel 10 or a thickness direction of a semiconductor circuit substrate 100. In this case, "a left side", "a right side", "an upper side", and "a lower side" indicate directions when the display panel 10 is viewed in a plane (e.g., in a plan view). For example, "the right side" indicates one side of the first direction DR1, "the left side" indicates the other side of the first direction DR1, "the upper side" indicates one side of the second direction DR2, and "the lower side" indicates the other side of the second direction DR2. Further, "an upper portion" indicates one side of the third direction DR3, and "a lower portion" indicates the other side of the third direction DR3.

Referring to FIGS. 1 and 2, the display device according to one or more embodiments includes the display panel 10 including a display region DA and a non-display region NDA.

The display panel 10 may have a quadrangular planar shape having long sides in the first direction DR1 and short sides in the second direction DR2. However, the planar shape of the display panel 10 is not limited thereto, and may include polygonal planar shapes other than the quadrangular planar shape, a circular planar shape, an oval planar shape, and/or an irregular planar shape.

The display region DA may be a region on which an image is displayed, and the non-display region NDA may be a region on which an image is not displayed. The non-display region NDA may surround a periphery of the display region DA. The non-display region NDA may constitute a bezel of the display panel 10. In each of the non-display regions NDA, lines and/or circuit drivers included in the display panel 10 may be positioned, and/or external devices may be mounted.

The display region DA of the display panel 10 may include a plurality of pixels PX. Each of the plurality of pixels PX may include a plurality of light emitting elements LE. Each of the pixels PX may include one or more light emitting elements LE to display a set or specific color. The pixel PX may be formed of the plurality of light emitting elements LE (e.g., LE1, LE2, LE3, and/or LE4) and the pixel PX may be defined as a minimum light emitting unit capable of displaying white light.

For example, a first light emitting element LE1 may emit light of a first color, a second light emitting element LE2 and a fourth light emitting element LE4 may emit light of a second color, and a third light emitting element LE3 may emit light of a third color. For example, the first color may be red, the second color may be green, and the third color may be blue. For example, a main peak wavelength of the first color light may be located at approximately 600 nm to 750 nm, a main peak wavelength of the second color light may be located at approximately 480 nm to 560 nm, and a main peak wavelength of the third color light may be located at approximately 370 nm to 460 nm, but the present disclosure is not limited thereto. For example, the light emitting elements LE may emit light of the same color, and any one of the light emitting elements LE may emit light of a yellow color. A main peak wavelength of yellow light may be located at approximately 550 nm to 600 nm. In one or more embodiments, one pixel PX may include four light emitting elements LE1, LE2, LE3, and LE4, but the present disclosure is not limited thereto.

Each of the light emitting elements LE may have a circular shape in a plan view. However, the present disclosure is not limited thereto, and the light emitting element LE may have a polygonal shape such as a quadrangular shape or a pentagonal shape, an oval shape, and/or an irregular shape, in addition to (or instead of) the circular shape.

The plurality of light emitting elements LE1, LE2, LE3, and LE4 may be spaced apart from each other in the first direction DR1 and the second direction DR2. The first light emitting element LE1 and the third light emitting element LE3 may be alternately arranged with each other in the first direction DR1 and the second direction DR2. The second light emitting element LE2 and the fourth light emitting element LE4 may be alternately arranged with each other in the first direction DR1 and the second direction DR2.

The plurality of light emitting elements LE1, LE2, LE3, and LE4 may be alternately arranged in diagonal directions DD1 and DD2 between the first direction DR1 and the second direction DR2. A first diagonal direction DD1 may be a direction inclined at approximately 45° relative to the first and second directions DR1 and DR2, and a second diagonal direction DD2 may be a direction orthogonal (e.g., substantially perpendicular) to the first diagonal direction DD1.

For example, the first light emitting element LE1 and the second light emitting element LE2 may be alternately arranged with each other in the first diagonal direction DD1. The third light emitting element LE3 and the fourth light emitting element LE4 may be alternately arranged with each other in the first diagonal direction DD1. The first light emitting element LE1 and the fourth light emitting element LE4 may be alternately arranged with each other in the second diagonal direction DD2. The second light emitting element LE2 and the third light emitting element LE3 may be alternately arranged with each other in the second diagonal direction DD2.

An area of the first light emitting element LE1, an area of the second light emitting element LE2, an area of the third light emitting element LE3, and an area of the fourth light emitting element LE4 may be substantially the same, but the present disclosure is limited thereto. For example, the area of the first light emitting element LE1 may be larger than the areas of the second light emitting element LE2 to the fourth light emitting element LE4.

Each of the light emitting elements LE may be electrically connected (e.g., electrically coupled) to a pixel electrode (e.g., element 'AE' in FIG. 5) of a semiconductor circuit substrate (e.g., element '100' in FIG. 5) through a first connection electrode (e.g., element 'CNE1' in FIG. 5) to be described herein below. Further, each of the light emitting elements LE may be electrically connected to a common electrode layer (e.g., element 'CEL' in FIG. 5) of a display substrate (e.g., element '200' in FIG. 5).

Figure 5:
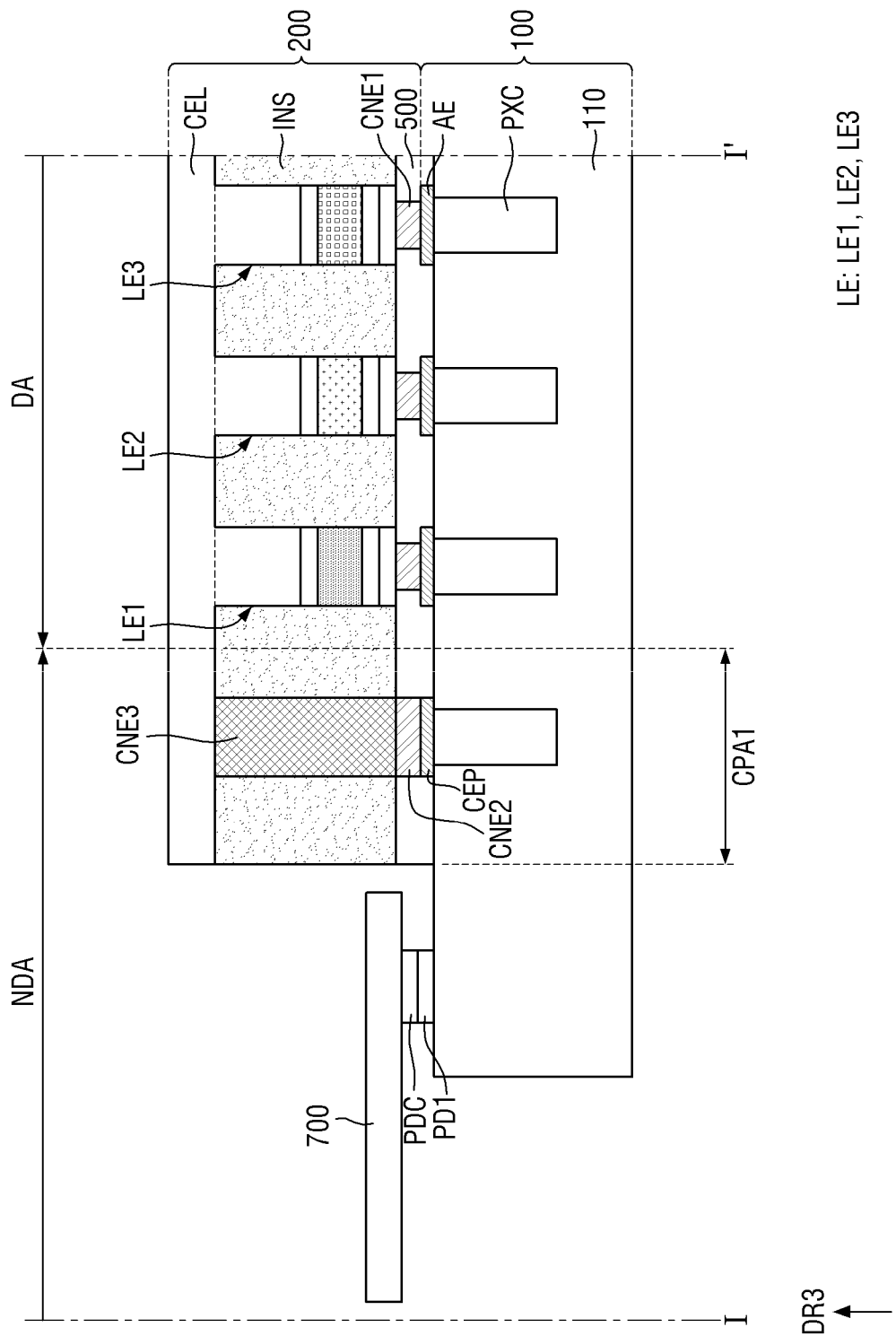
FIG. 5 is a cross-sectional view taken along line I-I' in FIG. 2.

In one or more embodiments, the light emitting elements LE may be partitioned by an emission defining film (e.g., element 'INS' in FIG. 5). The light emitting elements LE may have light emitting regions defined by the emission defining film INS. The emission defining film INS may surround each of the light emitting elements LE, and may come into direct contact with side surfaces of the light emitting elements LE. Accordingly, the light emitting elements LE may not be exposed to external foreign substances, for example, dust and/or air during a fabricating process of the display device (or such exposure may be reduced). Further, because each of the light emitting elements LE may be partitioned by the emission defining film INS, the light emitting elements LE may be individualized without an etching process of the light emitting elements LE. This will be described in more detail with further reference to other drawings.

The non-display region NDA of the display panel 10 may include a first common electrode region CPA1, a second common electrode region CPA2, a first pad region PDA1, and a second pad region PDA2.

The first common electrode region CPA1 may be between the first pad region PDA1 and the display region DA. The second common electrode region CPA2 may be between the second pad region PDA2 and the display region DA. Each of the first common electrode region CPA1 and the second common electrode region CPA2 may include common electrode connection parts CEP. The common electrode connection parts CEP may be spaced apart from each other in the first direction DR1 in the common electrode regions CPA1 and CPA2, but the present disclosure is not limited thereto.

The common electrode connection parts CEP may be on the semiconductor circuit substrate 100 to receive a common voltage from a pixel circuit part PXC. As will be described in more detail hereinbelow, each of the common electrode regions CPA1 and CPA2 may include a third connection electrode CNE3 in direct contact with the common electrode connection part CEP. The third connection electrode CNE3 may overlap each of the common electrode connection parts CEP. The third connection electrode CNE3 may be electrically connected (e.g., electrically coupled) to each of the common electrode connection part CEP and the common electrode layer CEL.

The first pad region PDA1 may be at an upper side of the display panel 10. The first pad region PDA1 may include first pads PD1 connected to a circuit board (e.g., element '700' in FIG. 5). The second pad region PDA2 may be at a lower side of the display panel 10. The second pad region PDA2 may include second pads to be connected to the circuit board 700. The second pad region PDA2 may be omitted in some embodiments.

The first pads PD1 may be electrically connected to the circuit board 700. The first pads PD1 may be arranged to be spaced apart from each other in the first direction DR1 in the first pad region PDA1. The arrangement of the first pads PD1 may be designed according to the number of light emitting elements LE in the display region DA and the arrangement of lines electrically connected thereto. The arrangement of pads different from each other may be variously modified according to the arrangement of the light emitting elements LE and the arrangement of the lines electrically connected thereto.

Figure 3:
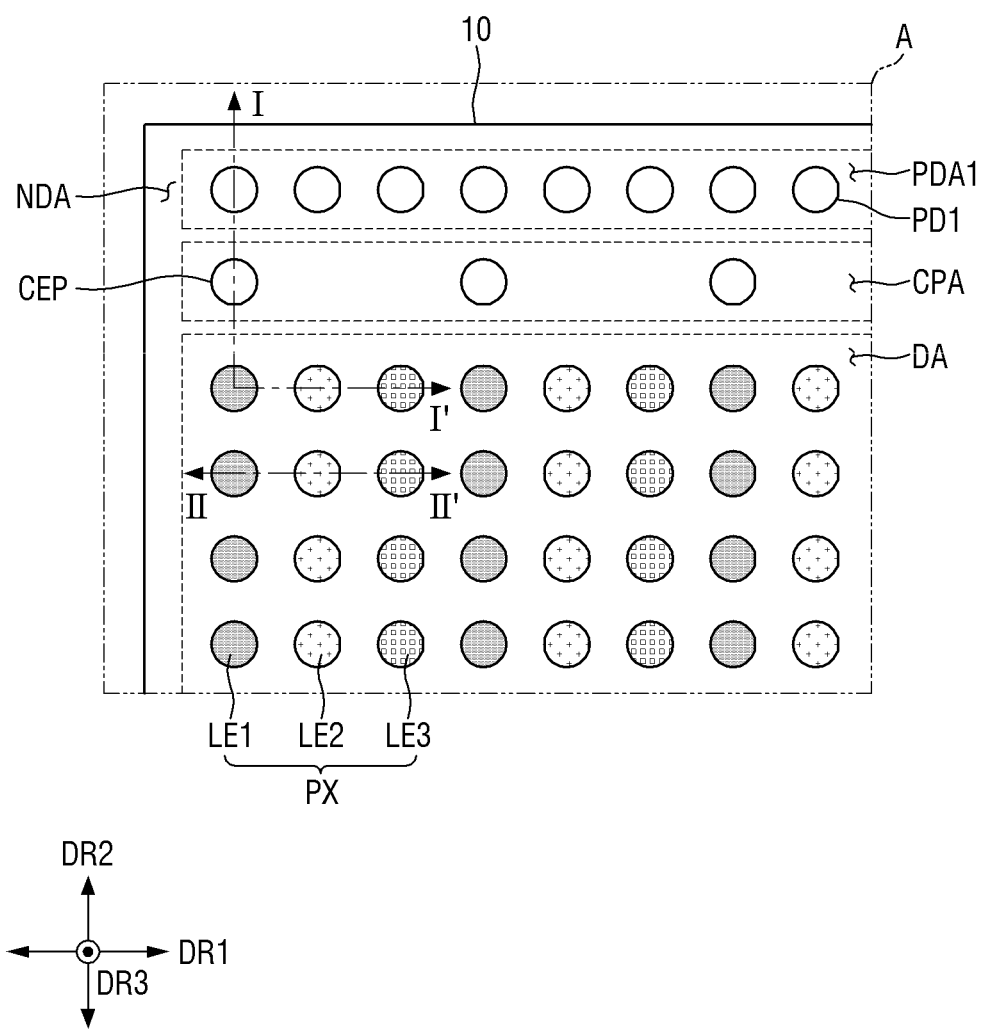
FIG. 3 is an enlarged plan view illustrating another example of region A in FIG. 1.

FIG. 3 is an enlarged plan view illustrating another example of region A in FIG. 1.

In FIG. 3, one pixel PX may include three light emitting elements including a first light emitting element LE1, a second light emitting element LE2, and a third light emitting element LE3. The pixels PX may be arranged in a matrix direction (e.g., matrix orientation) similar to the light emitting elements LE.

For example, one pixel PX may include the first light emitting element LE1, the second light emitting element LE2, and the third light emitting element LE3. The first light emitting element LE1 may emit light of a first color, the second light emitting element LE2 may emit light of a second color, and the third light emitting element LE3 may emit light of a third color. For example, the first color may be red, the second color may be green, and the third color may be blue. However, the present disclosure is not limited thereto, and the light emitting elements LE may emit light of the same color. In one or more embodiments, one pixel PX may include three light emitting elements LE1, LE2, and LE3, but the present disclosure is not limited thereto.

Each of the light emitting elements LE may have a circular shape in a plan view. However, the present disclosure is not limited thereto, and the light emitting element LE may have a polygonal shape such as a quadrangular shape or a pentagonal shape, an oval shape, and/or an irregular shape in addition to the circular shape.

The plurality of light emitting elements LE1, LE2, and LE3 may be spaced apart from each other in the first direction DR1 and the second direction DR2. The first light emitting element LE1, the second light emitting element LE2, and the third light emitting element LE3 are alternately arranged with each other in the first direction DR1, and the plurality of first light emitting elements LE1 may be repeatedly arranged with each other in the second direction DR2, the plurality of second light emitting elements LE2 may be repeatedly arranged with each other in the second direction DR2, and the plurality of third light emitting elements LE3 may be repeatedly arranged with each other in the second direction DR2. The first light emitting elements LE1, the second light emitting elements LE2, and the third light emitting elements LE3 are sequentially arranged in the first direction DR1, and this arrangement may be repeated.

An area of the first light emitting element LE1, an area of the second light emitting element LE2, an area of the third light emitting element LE3, and an area of the fourth light emitting element LE4 may be substantially the same, but the present disclosure is limited thereto. For example, the area of the first light emitting element LE1 may be larger than the areas of the second light emitting element LE2 and the third light emitting element LE3.

Figure 4:
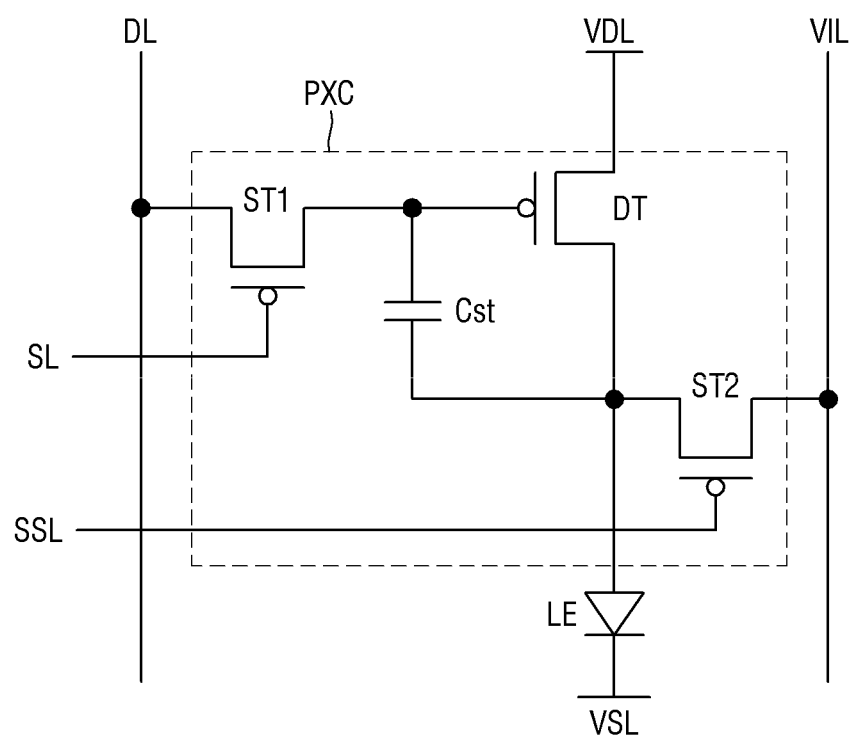
FIG. 4 is a circuit diagram of a pixel circuit and a light emitting element according to one or more embodiments.

FIG. 4 is a circuit diagram of the pixel circuit part and the light emitting element according to one or more embodiments.

Referring to FIG. 4, each of the plurality of pixels PX may include the light emitting element LE and the pixel circuit part PXC which controls an emission amount of the light emitting element LE.

The light emitting elements LE emit light according to a driving current Ids. The emission amount of the light emitting elements LE may be proportional to the driving current Ids. The light emitting element LE may be an inorganic light emitting element including an anode electrode, a cathode electrode, and an inorganic semiconductor between the anode electrode and the cathode electrode. For example, the light emitting element LE may be a micro light emitting diode.

The anode electrode of the light emitting element LE may be connected (e.g., electrically coupled) to a source electrode of a driving transistor DT, and the cathode electrode may be connected (e.g., electrically coupled) to a second power supply line VSL to which a low potential voltage lower than a high potential voltage is supplied. In the circuit diagram of FIG. 4, an example in which the anode electrode of the light emitting element LE is the pixel electrode (e.g., element 'AE' in FIG. 5) and the cathode electrode is the common electrode connection part (e.g., element 'CEP' in FIG. 5) is described.

The driving transistor DT adjusts a current flowing from a first power supply line VDL, to which a first power supply voltage is supplied, to the light emitting element LE according to a voltage difference between a gate electrode and the source electrode of the driving transistor DT. The gate electrode of the driving transistor DT may be connected to a first electrode of a first transistor ST1, the source electrode of the driving transistor DT may be connected to the anode electrode of the light emitting element LE, and a drain electrode of the driving transistor DT may be connected to the first power supply line VDL to which the high potential voltage is applied.

The first transistor ST1 is turned on by a scan signal of a scan line SL to connect a data line DL to the gate electrode of the driving transistor DT. A gate electrode of the first transistor ST1 may be connected to the scan line SL, the first electrode (e.g., source electrode) of the first transistor ST1 may be connected to the gate electrode of the driving transistor DT, and a second electrode (e.g., drain electrode) of the first transistor ST1 may be connected to the data line DL.

A second transistor ST2 is turned on by a sensing signal of a sensing signal line SSL to connect an initialization voltage line VIL to the source electrode of the driving transistor DT. A gate electrode of the second transistor ST2 may be connected to the sensing signal line SSL, a first electrode (e.g., source electrode) of the second transistor ST2 may be connected to the initialization voltage line VIL, and a second electrode (e.g., drain electrode) of the second transistor ST2 may be connected to the source electrode of the driving transistor DT.

In each of the first and second transistors ST1 and ST2, the first electrode may be a source electrode, and the second electrode may be a drain electrode, but it should be noted that the present disclosure is not limited thereto. For example, in each of the first and second transistors ST1 and ST2, the first electrode may be a drain electrode, and the second electrode may be a source electrode.

A capacitor Cst is formed between the gate electrode and the source electrode of the driving transistor DT. The capacitor Cst stores a difference voltage between a gate voltage and a source voltage of the driving transistor DT.

However, the above is only an example, and the pixel circuit part PXC may be formed in a structure further including a plurality of transistors.

Further, in FIG. 4, although an example in which the driving transistor DT and the first and second transistors ST1 and ST2 are NMOS transistors is described, some or all of the transistors may be provided as PMOS transistors.

Figure 6:
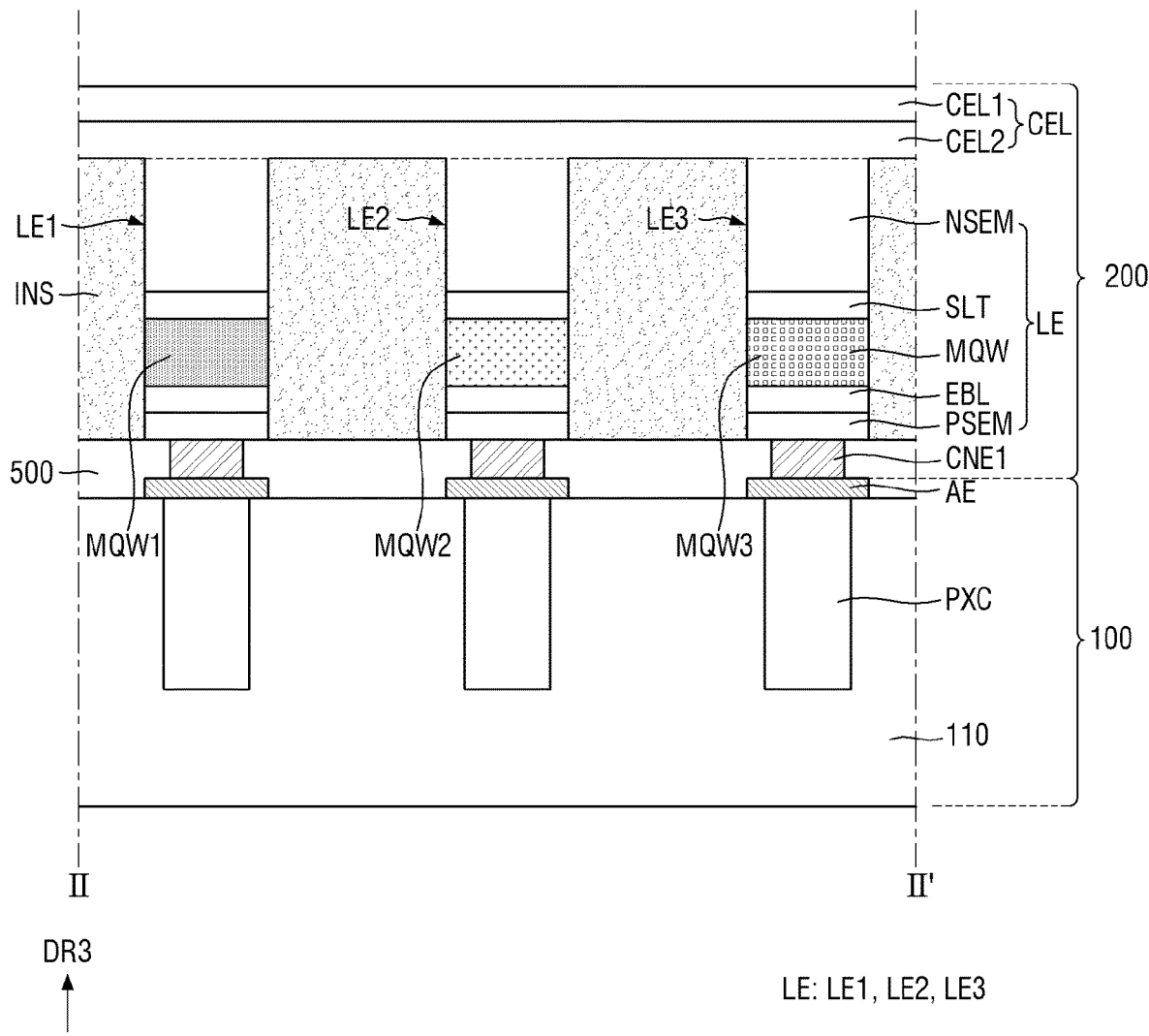
FIG. 6 is a cross-sectional view taken along line II-II' in FIG. 2.

FIG. 5 is a cross-sectional view taken along line I-I' in FIG. 2, and FIG. 6 is a cross-sectional view taken along line II-II' in FIG. 2. FIG. 5 illustrates a cross-section crossing the plurality of light emitting elements LE and the common electrode connection parts CEP respectively in the display region DA and the non-display region NDA.

Referring to FIGS. 5 and 6, the display device 1 according to one or more embodiments may include the semiconductor circuit substrate 100, and the display substrate 200.

The semiconductor circuit substrate 100 may include a first substrate 110, a plurality of pixel circuit parts PXC, pixel electrodes AE, and the common electrode connection parts CEP. The display substrate 200 may include the light emitting elements LE, the emission defining film INS, the common electrode layer CEL, and connection electrodes CNE1, CNE2, and CNE3. The display device 1 may further include a filling layer 500 between the semiconductor circuit substrate 100 and the display substrate 200, and a circuit board 700 in the non-display region NDA.

The first substrate 110 may be a silicon wafer substrate. The first substrate 110 may be formed of single crystal silicon.

Each of the plurality of pixel circuit parts PXC may be on the first substrate 110. Each of the plurality of pixel circuit parts PXC may include a complementary metal-oxide semiconductor (CMOS) circuit formed using a semiconductor process. Each of the plurality of pixel circuit parts PXC may include at least one transistor formed by the semiconductor process. Further, each of the plurality of pixel circuit parts PXC may further include at least one capacitor formed by the semiconductor process.

The plurality of pixel circuit parts PXC may be provided in the display region DA and the non-display region NDA. Among the plurality of pixel circuit parts PXC, each of the plurality of pixel circuit parts PXC in the display region DA may be electrically connected to the pixel electrode AE corresponding thereto. For example, the plurality of pixel circuit parts PXC and the plurality of pixel electrodes AE may be connected in a one-to-one manner. Each of the plurality of pixel circuit parts PXC may apply an anode voltage to the corresponding pixel electrode AE.

Among the plurality of pixel circuit parts PXC, the pixel circuit parts PXC in the non-display region NDA may be electrically connected to the common electrode connection parts CEP corresponding thereto, respectively. Each of the plurality of pixel circuit parts PXC may apply a cathode voltage from the second power supply line (e.g., element 'VSL' in FIG. 4) to the common electrode connection part CEP. Each of the plurality of pixel circuit parts PXC may overlap the common electrode connection part CEP, a second connection electrode CNE2, and the third connection electrode CNE3 in the third direction DR3.

The plurality of pixel electrodes AE may be provided in the display region DA, and may be respectively positioned on the pixel circuit part PXC corresponding thereto. Each of the pixel electrodes AE may be an exposed electrode integrally formed with the pixel circuit part PXC and exposed from the pixel circuit part PXC. For example, each of the pixel electrodes AE may protrude from an upper surface of the pixel circuit part PXC. Each of the pixel electrodes AE may receive the anode voltage from the pixel circuit part PXC. The pixel electrode AE may include a metal material such as aluminum (Al), but the type (or kind) of the pixel electrode AE is not limited thereto.

The plurality of common electrode connection parts CEP may be arranged in the common electrode regions CPA1 and CPA2 of the non-display region NDA, and may be respectively on the pixel circuit parts PXC corresponding thereto. The common electrode connection part CEP may be an exposed electrode that is integrally formed with the pixel circuit part PXC and exposed from the pixel circuit part PXC. For example, each of the common electrode connection parts CEP may protrude from an upper surface of the pixel circuit part PXC. The common electrode connection part CEP may include a metal material such as aluminum (Al), but the type (or kind) of the common electrode connection part CEP is not limited thereto.

The common electrode connection parts CEP may electrically connect the second power supply line VSL of the pixel circuit part PXC and the third connection electrode CNE3, the second connection electrode CNE2, and the common electrode layer CEL of the display substrate 200. Accordingly, a voltage applied to the common electrode layer CEL through the common electrode connection part CEP may be applied to the light emitting element LE.

The plurality of first pads PD1 are provided in the first pad region PDA1 in the non-display region NDA. The plurality of first pads PD1 may be spaced apart from the common electrode connection part CEP. The plurality of first pads PD1 may be spaced apart from the common electrode connection part CEP toward an outer side of the non-display region NDA.

A pad connection electrode PDC may be positioned on the first pad PD1. The pad connection electrode PDC may come into contact with an upper surface of the first pad PD1 and may include the same material as the third connection electrode CNE3. In some embodiments, the pad connection electrode PDC may be connected to a circuit pad CPD1 of the circuit board 700 through a conductive connection member such as a wire and/or the like. For example, the first pad PD1, the pad connection electrode PDC, the wire, and the circuit pad CPD1 of the circuit board 700 may be electrically connected to each other.

In one or more embodiments, the semiconductor circuit substrate 100 and the circuit board 700 may be arranged on a lower substrate. The semiconductor circuit substrate 100 and the circuit board 700 may be attached to an upper surface of the lower substrate using an adhesive member such as a pressure sensitive adhesive.

The circuit board 700 may be a flexible printed circuit board (FPCB), a printed circuit board (PCB), a flexible printed circuit (FPC), and/or a flexible film such as a chip on film (COF).

The display substrate 200 may include the plurality of light emitting elements LE, the emission defining film INS, which defines the light emitting elements LE, and the common electrode layer CEL, and may be arranged on the semiconductor circuit substrate 100. The light emitting elements LE may correspond to the plurality of pixel electrodes AE of the semiconductor circuit substrate 100.

The emission defining film INS (can also be referred to as a bank layer, or a pixel defining layer) may be provided between the pixel electrode AE of the semiconductor circuit substrate 100 and the common electrode layer CEL. The emission defining film INS may not overlap the pixel electrode AE, may overlap the common electrode layer CEL, and may come into direct contact with a lower surface of the common electrode layer CEL. The emission defining film INS may include a plurality of openings (see e.g., OP1, OP2, and OP3 in FIG. 10) which expose the common electrode layer CEL. The openings OP1, OP2, and OP3 may provide spaces where the light emitting elements LE of each pixel PX are formed, and may define light emitting regions thereof. For example, the emission defining film INS may surround each of the light emitting elements LE, and may be directly on a side surface of each of light emitting elements LE. Because the light emitting element LE is positioned in the emission defining film INS, and the opening OP of the emission defining film INS determines a growth region of the light emitting element LE, at least one surfaces of the emission defining film INS and the light emitting element LE may be flat (or substantially flat). For example, at least one of upper and lower surfaces of the emission defining film INS and the light emitting element LE may be flat (or substantially flat). The drawing illustrates that both the upper and lower surfaces of the emission defining film INS and the light emitting element LE are flat (or substantially flat). In this case, a height of the emission defining film INS and a height of the light emitting element LE may be the same. Here, the upper surface is a surface which comes into contact with the common electrode layer CEL, and may be defined as one surface of a second semiconductor layer NSEM. The lower surface is a surface which comes into contact with the first connection electrode CNE1, and may be defined as one surface of a first semiconductor layer PSEM. In one or more embodiments, the height of the emission defining film INS may be different from that of the light emitting element LE. In this case, the upper surface and/or the lower surface of the emission defining film INS and the light emitting element LE may not be flat.

The emission defining film INS may protect the light emitting element LE from external foreign substances, for example, dust and/or air, and may insulate the light emitting element LE from other layers. The emission defining film INS may include an inorganic insulating material such as silicon nitride ($SiN_x$), silicon oxide ($SiO_x$), silicon oxynitride ($SiO_xN_y$), aluminum oxide ($AlO_y$), aluminum nitride ($AlN_x$), and/or the like.

When the light emitting elements are individualized (e.g., prepared individually) by dry etching, a sidewall effect in which sidewalls of the light emitting elements are chemically and/or structurally damaged may occur. For example, the sidewalls of the light emitting elements may be damaged by an etching etchant in a dry etching process. In this case, non-radiative recombination in which electrons and holes recombine without generation of light at the sidewalls of the light emitting elements may occur, and accordingly, internal quantum efficiency (IQE/EQE) may be lowered, and deterioration due to heating may occur.

In the display device 1 according to the present embodiments, because the opening OP of the emission defining film INS provides a space for forming the light emitting elements LE, a width, a height, a position, a shape, a distance, and/or the like of one opening OP of the emission defining film INS from another opening OP, may be substantially the same as a width, a height, a position, a shape, a distance, and/or the like of one light emitting element LE from another light emitting element LE. Accordingly, the light emitting regions of the light emitting elements LE are defined even when the sidewalls of the light emitting elements LE are not etched, and because these may be individualized, the sidewall effect of the light emitting element LE may be prevented or reduced. Accordingly, defects of the light emitting element LE may be prevented or reduced, and light efficiency may be improved.

The light emitting elements LE may be respectively provided in the openings OP of the emission defining film INS. Each of the light emitting elements LE may be an inorganic light emitting diode element. The light emitting elements LE may include a plurality of semiconductor layers NSEM, PSEM, EBL, and SLT, and active layers MQW. The light emitting elements LE may be electrically connected to the pixel circuit parts PXC of the semiconductor circuit substrate 100 to emit light from the active layers MQW.

Each of the light emitting elements LE may have a shape extending in the third direction DR3 (for example, a thickness direction of the first substrate 110). In the light emitting element LE, a length in the third direction DR3 may be larger than a length in a horizontal direction, and for example, the length of the light emitting element LE in the third direction DR3 may be approximately 1 to 5 μm. The light emitting element LE may have a cylindrical shape, a disk shape, and/or a rod shape of which a width is larger than a height (e.g., a length is larger than a thickness). However, the present disclosure is not limited thereto, and the light emitting element LE may have various suitable shapes such as a shape of a rod, a wire, a tube, and/or the like, a shape of a polygonal pillar such as a regular hexahedron, a rectangular hexahedron, and/or a hexagonal pillar, a shape extending in one direction and having a partially inclined outer surface, and/or the like.

According to one or more embodiments, each of the light emitting elements LE may include the first semiconductor layer PSEM, an electron blocking layer EBL, the active layer MQW, a superlattice layer SLT, and the second semiconductor layer NSEM. The first semiconductor layer PSEM, the electron blocking layer EBL, the active layer MQW, the superlattice layer SLT, and the second semiconductor layer NSEM may be sequentially stacked in the third direction DR3.

The first semiconductor layer PSEM may be a p-type semiconductor, and may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may include one or more selected from among AlGaInN, GaN, AlGaN, InGaN, AlN, and InN doped with a p-type impurity. The first semiconductor layer PSEM may be doped with a p-type dopant, and the p-type dopant may include Mg, Zn, Ca, Ba, and/or the like. For example, the first semiconductor layer PSEM may be p-GaN doped with p-type Mg. The first semiconductor layer PSEM may have a thickness in a range of about 30 nm to about 200 nm.

The electron blocking layer EBL may be provided on the first semiconductor layer PSEM. The electron blocking layer EBL may prevent or reduce the injection of electrons (flowing into the active layer MQW) into another layer without being recombined with holes in the active layer MQW. For example, the electron blocking layer EBL may be p-AlGaN doped with p-type Mg. The electron blocking layer EBL may have a thickness in a range of about 10 nm to about 50 nm, but the present disclosure is not limited thereto. In some embodiments, the electron blocking layer EBL may be omitted.

The active layer MQW may be on the electron blocking layer EBL. The active layer MQW may emit light due to recombination of electrons and holes according to an emission signal applied through the first semiconductor layer PSEM and the second semiconductor layer NSEM. The active layer MQW may include a material having a single or multiple quantum well structure. When the active layer MQW includes a material having a multiple quantum well structure, the multiple quantum well structure may be a structure in which a plurality of well layers and barrier layers are alternately stacked. In this case, the well layer may be formed of InGaN, and the barrier layer may be formed of GaN and/or AlGaN, but the present disclosure is not limited thereto. For example, the active layer MQW may have a structure in which semiconductor materials having large band gap energy and semiconductor materials having small band gap energy are alternately stacked, and may include different Group 3 to Group 5 semiconductor materials according to the wavelength bands of the emitted light.

The superlattice layer SLT is on the active layer MQW. The superlattice layer SLT may relieve stress due to a difference in lattice constant between the second semiconductor layer NSEM and the active layer MQW. For example, the superlattice layer SLT may be formed of InGaN and/or GaN. A thickness of the superlattice layer SLT may be approximately 50 to 200 nm. However, in some embodiments, the superlattice layer SLT may be omitted.

The second semiconductor layer NSEM may be on the superlattice layer SLT. The second semiconductor layer NSEM may be an n-type semiconductor. The second semiconductor layer NSEM may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may include one or more selected from among AlGaInN, GaN, AlGaN, InGaN, AlN, and InN doped with an n-type impurity. The second semiconductor layer NSEM may be doped with an n-type dopant, and the n-type dopant may include Si, Ge, Sn, and/or the like. For example, the second semiconductor layer NSEM may be n-GaN doped with n-type Si. The second semiconductor layer NSEM may have a thickness in a range of about 500 nm to about 1 μm, but the present disclosure is not limited thereto.

According to one or more embodiments, some of the light emitting elements LE of the display device 1 may include different active layers MQWs to emit light of different colors. For example, the first light emitting element LE1 may emit red light of a first color by including a first active layer MQW1, the second light emitting element LE2 and the fourth light emitting element (see e.g., LE4 in FIG. 2) may emit green light of a second color by including a second active layer MQW2, and the third light emitting element LE3 may emit blue light of a third color by including a third active layer MQW3. The first light emitting element LE1, the second light emitting element LE2, the third light emitting element LE3, and the fourth light emitting element LE4 may differ in terms of the concentration of the dopant doped in the first semiconductor layer PSEM, the electron blocking layer EBL, the active layer MQW, the superlattice layer SLT, and the second semiconductor layer NSEM, or the 'x' value and the 'y' value of the chemical formula of $Al_xGa_yIn_{1-x-y}N$ ($0 \leq x \leq 1$, $0 \leq y \leq 1$, and $0 \leq x+y \leq 1$). The first to fourth light emitting elements LE1, LE2, LE3, and LE4 may have substantially the same structure and material, and may emit different colors of light as concentration ratios of the semiconductor layers are different.

For example, when the active layers MQW1, MQW2, and MQW3 include InGaN, the colors of the light emitted from the active layers MQW1, MQW2, and MQW3 may be different according to the content of indium (In). For example, a wavelength band of the light emitted from the active layer may move to a red wavelength band as the content of indium (In) increases, and the wavelength band of the light emitted from the active layer may move to a blue wavelength band as the content of indium (In) decreases. Accordingly, the content of indium (In) in the first active layer MQW1 may be larger than the content of indium (In) in each of the second active layer MQW2 and the third active layer MQW3. Further, the content of indium (In) in the second active layer MQW2 may be larger than the content of indium (In) in the third active layer MQW3. For example, the content of indium (In) in the third active layer MQW3 may be approximately 15%, the content of indium (In) in the second active layer MQW2 may be approximately 25%, and the content of indium (In) in the first active layer MQW1 may be 35% or more. For example, the light emitting element LE may emit light of different colors by adjusting the contents of indium (In) in the active layers MQW.

In one or more embodiments, lattice constants in the active layers MQW1, MQW2, and MQW3 may be larger as the contents of indium (In) in the active layers MQW1, MQW2, and MQW3 are higher. In the specification, the lattice constant is a constant for defining the arrangement of atoms, which constitute a crystal of the material (e.g., InGaN) of the active layers MQW1, MQW2, and MQW3, where the atoms have regularity in a three-dimensional space and are repeatedly arranged, and the lattice constant may be expressed as an edge length of a unit cell which is a minimum repeating unit constituting the grid (for example, x-axis length: a, y-axis length: b, and z-axis length: c). Because the content of indium (In) decreases in the order of the first active layer MQW1, the second active layer MQW2, and the third active layer MQW3, the lattice constant of the first active layer (MQW1) is the largest, the lattice constant of the second active layer (MQW2) may be the next largest, and the lattice constant of the third active layer MQW3 may be the smallest.

A case in which the lattice constants in the active layers MQW1, MQW2, and MQW3 become larger as the contents of indium (In) in the active layers MQW1, MQW2, and MQW3 are higher (e.g., increase) refers to a case in which a separation distance between atoms of InGaN in each of the active layers MQW1, MQW2, and MQW3 is large; and in the case of the active layers MQW1, MQW2, and MQW3 grown in the z-axis direction (or thickness direction) from the common electrode layer CEL, when a and b values of the lattice constants are significantly larger than the lattice constants a and b constituting the material of the common electrode layer CEL at a lower side thereof, inner defects may occur in the active layers MQW1, MQW2, and MQW3 in the process of growing the active layers MQW1, MQW2, and MQW3. In one or more embodiments, the lattice constant of each of the active layers MQW1, MQW2, and MQW3 may be larger than the lattice constant of the common electrode layer CEL. As described above, because the lattice constant of the first active layer MQW1 is the largest, the lattice constant of the second active layer MQW2 is the next largest, and the lattice constant of the third active layer MQW3 is the smallest, specifically, the probability that the inner defect of the first active layer MQW1 occurs may be high. In the display device according to one or more embodiments, as will be described in more detail below in FIG. 8, after forming a first undoped semiconductor layer USEM1 on a second substrate 210 and then forming a second undoped semiconductor layer USEM2 having a larger lattice constant than the first undoped semiconductor layer USEM1 on the first undoped semiconductor layer USEM1, the common electrode layer CEL is formed on the second undoped semiconductor layer USEM2. Accordingly, in a process of growing the light emitting elements LE1, LE2, LE3, by increasing the lattice constant of the common electrode layer CEL, inner defects which may occur in the process of growing the first active layer MQW1 may be minimized or reduced, by minimizing or reducing a difference in lattice constant between the first active layer MQW1 and the common electrode layer CEL. Here, the lattice constant of the common electrode layer CEL is increased by the second undoped semiconductor layer USEM2 because atoms constituting a material of the second undoped semiconductor layer USEM2 and atoms constituting a material of the common electrode layer CEL are coupled in a process in which the second undoped semiconductor layer USEM2 and the common electrode layer CEL are coupled, and in this case, the second undoped semiconductor layer USEM2 and the common electrode layer CEL may be coupled as a difference between the lattice constant (here, a or b) of the material of the second undoped semiconductor layer USEM2 and the lattice constant (a or b) of the material of the common electrode layer CEL decreases. However, because the coupling is performed at an interface between the second undoped semiconductor layer USEM2 and the common electrode layer CEL, it should be apparent that a lattice constant increase value (e.g., an increase in value of the lattice constant) may decrease as a distance away from the interface between the common electrode layer CEL and the second undoped semiconductor layer USEM2 (e.g., toward the second undoped semiconductor layer USEM2) increases.

The above-described common electrode layer CEL may be on the emission defining film INS. The common electrode layer CEL may be connected to the second semiconductor layer NSEM. The common electrode layer CEL may be positioned over the entire surface of the display substrate 200 without distinction of the light emitting elements LE.

The common electrode layer CEL may be an n-type semiconductor including a material the same as that of the second semiconductor layer NSEM. The common electrode layer CEL may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may include one or more selected from among AlGaInN, GaN, AlGaN, InGaN, AlN, and InN doped with an n-type impurity. The common electrode layer CEL may be doped with an n-type dopant, and the n-type dopant may include Si, Ge, Sn, and/or the like. For example, the common electrode layer CEL may be n-GaN doped with n-type Si.

In the drawing, it is exemplified that the common electrode layer CEL includes the material the same as that of the second semiconductor layer NSEM to be integrated therewith, but the present disclosure is not limited thereto. In some embodiments, the common electrode layer CEL may be provided as a separate layer including a material different from that of the second semiconductor layer NSEM. The common electrode layer CEL may be electrically connected to the second semiconductor layer NSEM without being integrated with the second semiconductor layer NSEM.

In one or more embodiments, the common electrode layer CEL may include two or more layers including the same material but having different lattice constants. For example, the common electrode layer CEL may include a second common electrode layer CEL2 connected to the second semiconductor layer NSEM and a first common electrode layer CEL1 on the second common electrode layer CEL2. As described above with reference to FIG. 8, the common electrode layer CEL is formed on the second undoped semiconductor layer USEM2, and because the lattice constant increase value (e.g., an increase in value of the lattice constant) may decrease as a distance away from the interface between the common electrode layer CEL and the second undoped semiconductor layer USEM2 (e.g., toward the second undoped semiconductor layer USEM2) increases, a lattice constant of the first common electrode layer CEL1 close to the second undoped semiconductor layer USEM2 may be larger than a lattice constant of the second common electrode layer CEL2. In FIG. 6, although the common electrode layer CEL is illustrated as two separate layers for convenience of explanation, as described above, because the lattice constant increase value (e.g., an increase in value of the lattice constant) may decrease as a distance away from the interface between the common electrode layer CEL and the second undoped semiconductor layer USEM2 (e.g., toward the second undoped semiconductor layer USEM2) increases, the common electrode layer CEL may be divided into three or more layers having different lattice constants. However, even in the case of the second common electrode layer CEL2 formed on the second undoped semiconductor layer USEM2 shown in FIG. 6, the lattice constant increases more than a lattice constant of the material itself constituting the second common electrode layer CEL2.

The plurality of connection electrodes CNE: CNE1, CNE2, and CNE3 may be provided between the display substrate 200 and the semiconductor circuit substrate 100. The connection electrodes CNE1, CNE2, and CNE3 may include the first connection electrodes CNE1 between the light emitting elements LE and the pixel electrodes AE, and the second connection electrode CNE2 and the third connection electrode CNE3 between the common electrode layer CEL and the common electrode connection part CEP.

The first connection electrodes CNE1 may correspond to the light emitting elements LE and the pixel electrodes AE in the display region DA. The first connection electrodes CNE1 may be on one (e.g., first) surfaces of the first semiconductor layers PSEM of the light emitting elements LE.

The first connection electrode CNE1 may be directly on the pixel electrode AE, and may be electrically connected to the pixel electrode AE to transmit a light emitting signal applied to the pixel electrode AE to the light emitting element LE. A width of the first connection electrode CNE1 may be smaller than the width of the light emitting element LE, but the present disclosure is not limited thereto. The first connection electrode CNE1 may serve as a bonding metal for bonding the pixel electrode AE and the light emitting element LE to each other during a fabricating process. The first connection electrode CNE1 may include a material which may be electrically connected to the pixel electrode AE and the light emitting element LE. For example, the first connection electrode CNE1 may include at least one of gold (Au), copper (Cu), aluminum (Al), or tin (Sn), or may include a transparent conductive oxide such as indium tin oxide (ITO) and/or indium zinc oxide (IZO). In one or more embodiments, the first connection electrode CNE1 may include a first layer including any one of gold (Au), copper (Cu), aluminum (Al), or tin (Sn), and a second layer including another one of gold (Au), copper (Cu), aluminum (Al), or tin (Sn).

The second connection electrode CNE2 and the third connection electrode CNE3 may correspond to the common electrode connection part CEP in the first common electrode region CPA1. The third connection electrode CNE3 may be on the common electrode connection part CEP, and the second connection electrode CNE2 may be between the third connection electrode CNE3 and the common electrode connection part CEP.

The second connection electrode CNE2 may have a shape extending in one direction and may be positioned in an opening of the emission defining film INS.

The second connection electrode CNE2 may be directly on and come into contact with the common electrode connection part CEP. The second connection electrode CNE2 may be electrically connected to the common electrode connection part CEP, and may be electrically connected to any one of the pads through the pixel circuit part PXC provided in the non-display region NDA.

The second connection electrode CNE2 and the third connection electrode CNE3 may each include a material which may be electrically connected to the common electrode connection part CEP. For example, the second connection electrode CNE2 and the third connection electrode CNE3 may each include at least one of gold (Au), copper (Cu), aluminum (Al), or tin (Sn). In one or more embodiments, the second connection electrode CNE2 and the third connection electrode CNE3 may each include a first layer including any one of gold (Au), copper (Cu), aluminum (Al), or tin (Sn), and a second layer including another one of gold (Au), copper (Cu), aluminum (Al), or tin (Sn).

The filling layer 500 may be between the semiconductor circuit substrate 100 and the display substrate 200. The filling layer 500 may fill a space formed between the first substrate 110 and the common electrode layer CEL by (e.g., due to) a step difference between the pixel electrodes AE and the common electrode connection parts CEP of the semiconductor circuit substrate 100, and the light emitting elements LE of the display substrate 200. For example, the filling layer 500 may fill a space between the pixel electrodes AE neighboring to each other in a horizontal direction, the first connection electrodes CNE1 neighboring to each other in the horizontal direction, and the common electrode connection parts CEP. The filling layer 500 may be a region filled with air or a vacuum region. The filling layer 500 may serve to insulate exposed electrodes. The filling layer 500 is not limited thereto, and may include an inorganic insulating material such as silicon oxide ($SiO_x$), silicon nitride ($SiN_x$), silicon oxynitride ($SiO_xN_y$), and/or the like, or may include an organic insulating material.

Hereinafter, a process of fabricating the display device 1 will be described with further reference to other drawings.

Figure 7:
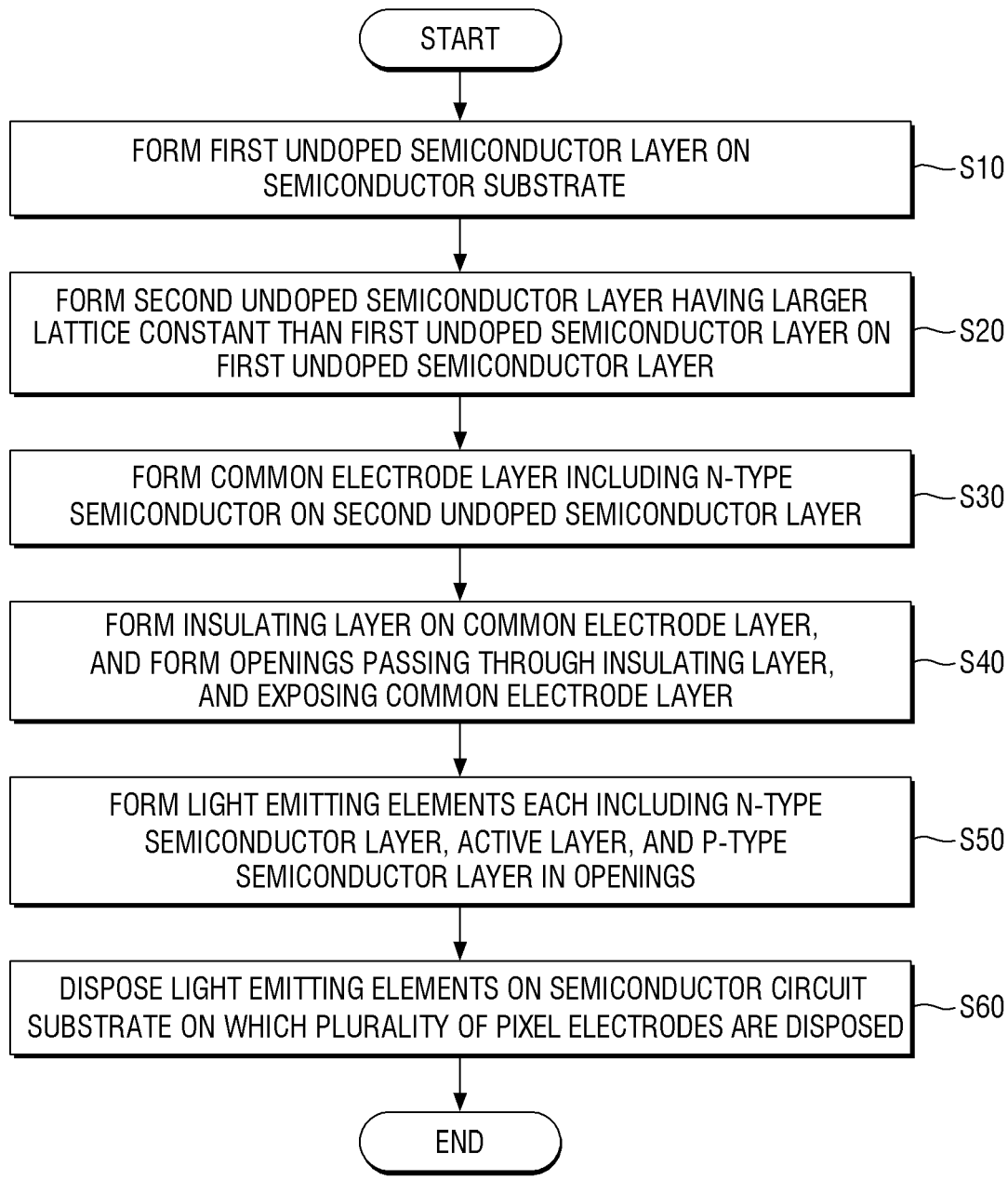
FIG. 7 is a flow chart illustrating a method of fabricating a display device according to one or more embodiments.

FIG. 7 is a flow chart illustrating a method of fabricating a display device according to one or more embodiments. FIGS. 8 to 17 are cross-sectional views for describing process operations (e.g., acts) of the method of fabricating a display device according to one or more embodiments.

Referring to FIG. 7, the method of fabricating the display device 1 according to one or more embodiments, may include forming a first undoped semiconductor layer USEM1 on a second substrate 210 (S10), forming a second undoped semiconductor layer USEM2 having a larger lattice constant than the first undoped semiconductor layer USEM1 on the first undoped semiconductor layer USEM1 (S20), forming a common electrode layer CEL including an n-type semiconductor on the second undoped semiconductor layer USEM2 (S30), forming an insulating layer INS on the common electrode layer CEL, and forming openings OP1, OP2, and OP3 passing through the insulating layer INS and exposing (e.g., to expose) the common electrode layer CEL (S40), forming light emitting elements LE1, LE2, LE3 each including an n-type semiconductor layer, an active layer, and a p-type semiconductor layer in the openings OP1, OP2, and OP3 (S50), and disposing (e.g., arranging) the light emitting elements LE1, LE2, and LE3 on a semiconductor circuit substrate 100 on which a plurality of pixel electrodes AE are arranged (S60).

The method of fabricating the display device 1 may include a process of preparing a semiconductor circuit substrate 100 and a display substrate 200, and then bonding the semiconductor circuit substrate 100 and the display substrate 200 together. In the process of fabricating the display substrate 200, a process of preparing a base substrate SUB including the undoped semiconductor layer and the common electrode layer CEL, and forming the plurality of light emitting elements LE thereon may be performed. The light emitting elements LE may respectively include active layers MQW1, MQW2, and MQW3 having different materials, and may be formed by layers of different materials according to positions. Hereinafter, the manufacturing process will be described with reference to FIGS. 8 to 17, which are cross-sectional views for describing process operations of the fabricating method, together with FIG. 7.

Figure 8:
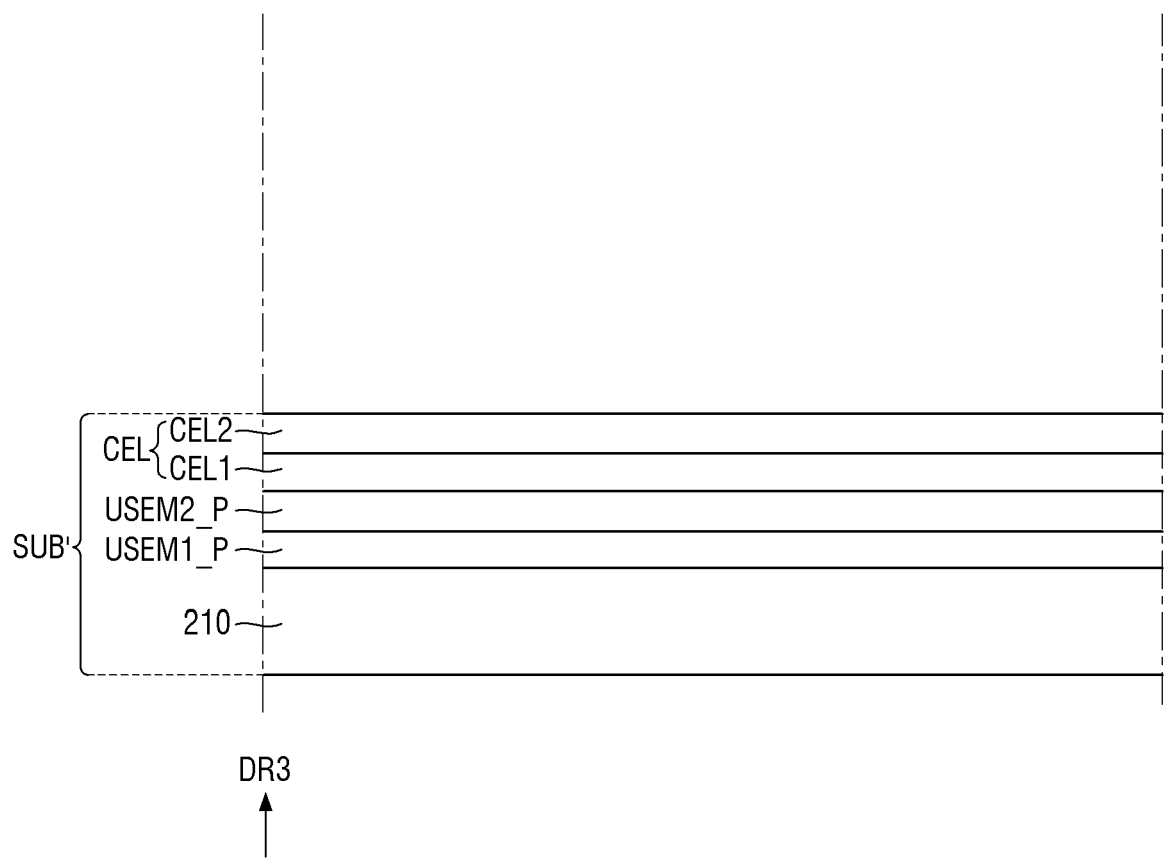
FIGS. 8-17 are cross-sectional views for describing process operations (e.g., acts) of the method of fabricating a display device according to one or more embodiments.
Figure 9:
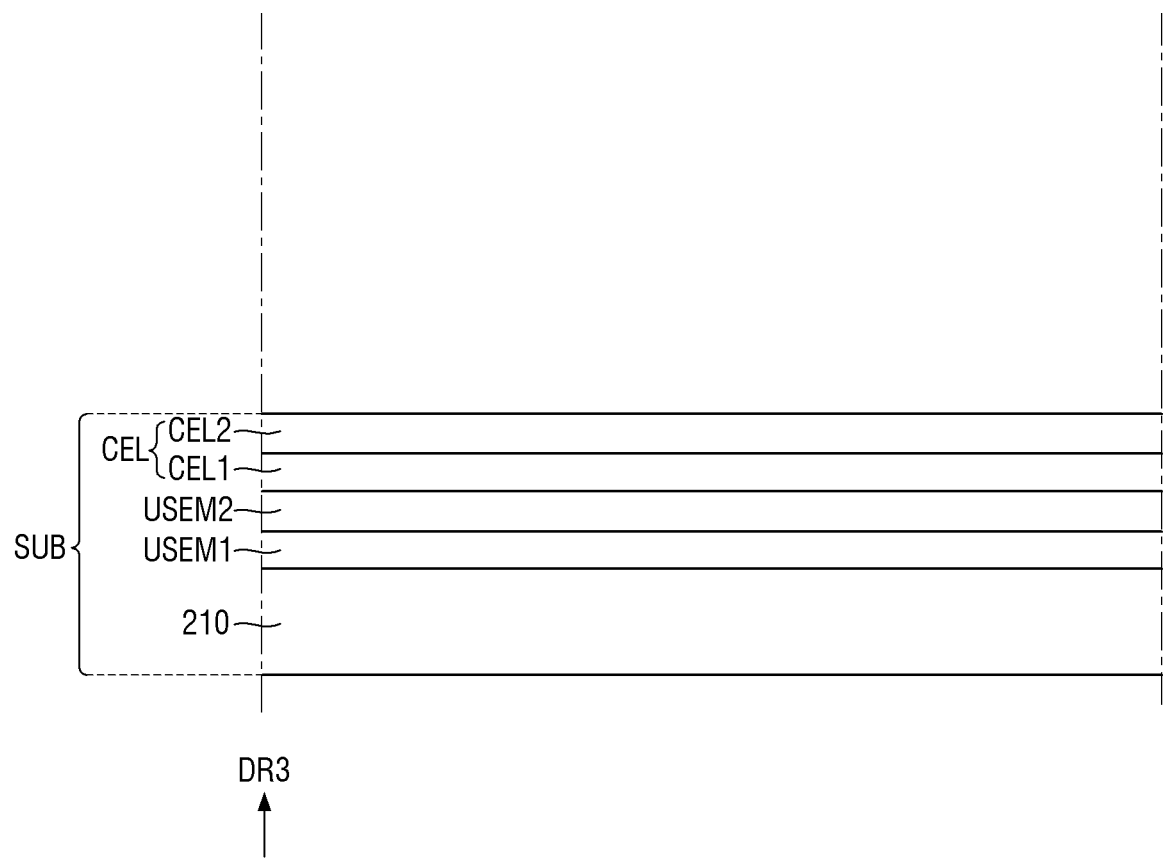

First, referring to FIGS. 8 and 9, the undoped semiconductor layer is formed on the second substrate 210 (S10 and S20), and thus the base substrate SUB in which the common electrode layer CEL is formed on the undoped semiconductor layer (S30) is prepared.

The base substrate SUB includes the second substrate 210, the undoped semiconductor layer on the second substrate 210, and the common electrode layer CEL on the undoped semiconductor layer. The second substrate 210 may be a sapphire substrate ($Al_2O_3$) or a silicon wafer including silicon. However, the present disclosure is not limited thereto, and the second substrate 210 may be a semiconductor substrate such as a GaAs substrate. Hereinafter, an example in which the second substrate 210 is a sapphire substrate will be described.

The undoped semiconductor layer and the common electrode layer CEL on the second substrate 210 are the same as described above. The common electrode layer CEL may be an n-type semiconductor, and the undoped semiconductor layer may include an undoped semiconductor, and may be a material not doped with an n-type or a p-type impurity. In an embodiment, for example, the common electrode layer CEL may be one or more of AlGaInN, GaN, AlGaN, InGaN, AlN, or InN doped with an n-type impurity. The undoped semiconductor layer may be at least one of undoped InAlGaN, GaN, AlGaN, InGaN, AlN, or InN, but the present disclosure is not limited thereto.

The undoped semiconductor layer may include the first undoped semiconductor layer USEM1 on the second substrate 210 and the second undoped semiconductor layer USEM2 on the first undoped semiconductor layer USEM1.

In one or more embodiments, lattice constants of the first undoped semiconductor layer USEM1 and the second undoped semiconductor layer USEM2 may be different from each other. The lattice constant of the second undoped semiconductor layer USEM2 may be larger than the lattice constant of the first undoped semiconductor layer USEM1. Each of the first and second undoped semiconductor layers USEM1 and USEM2 may include a porous undoped semiconductor material. For example, the first undoped semiconductor layer USEM1 may include porous GaN, and the second undoped semiconductor layer USEM2 may include porous InGaN. As described above, because the common electrode layer CEL may include a second common electrode layer CEL2 connected to the second semiconductor layer NSEM and a first common electrode layer CEL1 on the second common electrode layer CEL2, and the common electrode layer CEL is formed on the second undoped semiconductor layer USEM2, and because the lattice constant increase value (e.g., an increase in value of the lattice constant) may decrease as a distance away from the interface between the common electrode layer CEL and the second undoped semiconductor layer USEM2 (e.g., toward the second undoped semiconductor layer USEM2) increases, the lattice constant of the first common electrode layer CEL1 close to the second undoped semiconductor layer USEM2 may be larger than the lattice constant of the second common electrode layer CEL2. For example, the lattice constant may decrease in the order of the second undoped semiconductor layer USEM2, the first undoped semiconductor layer USEM1, the first common electrode layer CEL1, and the second common electrode layer CEL2 (e.g., in the order from the second undoped semiconductor layer USEM2 to the first undoped semiconductor layer USEM1, and from the first common electrode layer CEL1 to the second common electrode layer CEL2).

The undoped semiconductor layers USEM1 and USEM2 and the common electrode layer CEL may be formed through an epitaxial growth method. An epitaxial growth process may be performed by an electron beam deposition method, a physical vapor deposition (PVD) method, a chemical vapor deposition (CVD) method, a plasma laser deposition (PLD) method, a dual-type thermal evaporation method, a sputtering method, a metal-organic chemical vapor deposition (MOCVD) method, and/or the like. For example, forming the undoped semiconductor layers USEM1 and USEM2 and the common electrode layer CEL may be performed by metal-organic chemical vapor deposition (MOCVD), but present disclosure is not limited thereto.

A precursor material for forming a plurality of semiconductor material layers is not specifically limited within a range and may be any suitable target material. For example, the precursor material may be a metal precursor including an alkyl group such as a methyl group and/or an ethyl group. For example, the precursor material may be a compound such as trimethyl gallium ($Ga(CH_3)_3$), trimethyl aluminum ($Al(CH_3)_3$), and/or triethyl phosphate ($(C_2H_5)_3PO_4$), but the present disclosure is not limited thereto.

The above-described undoped semiconductor layers USEM1 and USEM2 may be formed by performing an electrochemical (EC) etching process on undoped semiconductor layers USEM1_P and USEM2_P of a base substrate SUB' before etching shown in FIG. 8. The undoped semiconductor layers USEM1 and USEM2 may each have a porous structure.

According to one or more embodiments, in order to perform the electrochemical etching process, a potassium hydroxide (KOH) or nitric acid ($HNO_3$) solution may be used, but the present disclosure is not limited thereto.

According to the embodiments, lattice constants of the undoped semiconductor layers USEM1_P and USEM2_P may be increased by forming porous structures through the electrochemical etching process. For example, the lattice constants of the undoped semiconductor layers USEM1 and USEM2 may increase in proportion to an increase in density of porous materials formed in the undoped semiconductor layers USEM1 and USEM2.

Because the porous structures are formed in the undoped semiconductor layers USEM1 and USEM2, and thus the undoped semiconductor layers USEM1 and USEM2 are formed on a stacked substrate, the occurrence of strain between adjacent layers may be prevented or reduced when a process of fabricating the light emitting elements LE1, LE2, and LE3 is performed.

According to the embodiments, the electrochemical etching process may be selectively applied to the undoped semiconductor layers USEM1_P and USEM2_P before etching. The electrochemical etching process may be selectively applied based on a concentration of a dopant provided to the individual semiconductor layer and an applied voltage. Further, in order to selectively apply the electrochemical etching process to the undoped semiconductor layers USEM1_P and USEM2_P before etching, the magnitude of a voltage to be used may be appropriately (or suitably) selected.

As described above, because the lattice constant of the corresponding semiconductor layer increases in proportion to an increase in density of the porous materials in the semiconductor layer, a porous density (e.g., porosity) of the second undoped semiconductor layer USEM2 may be larger than a porosity density (e.g., porosity) of the first undoped semiconductor layer USEM1.

Figure 10:
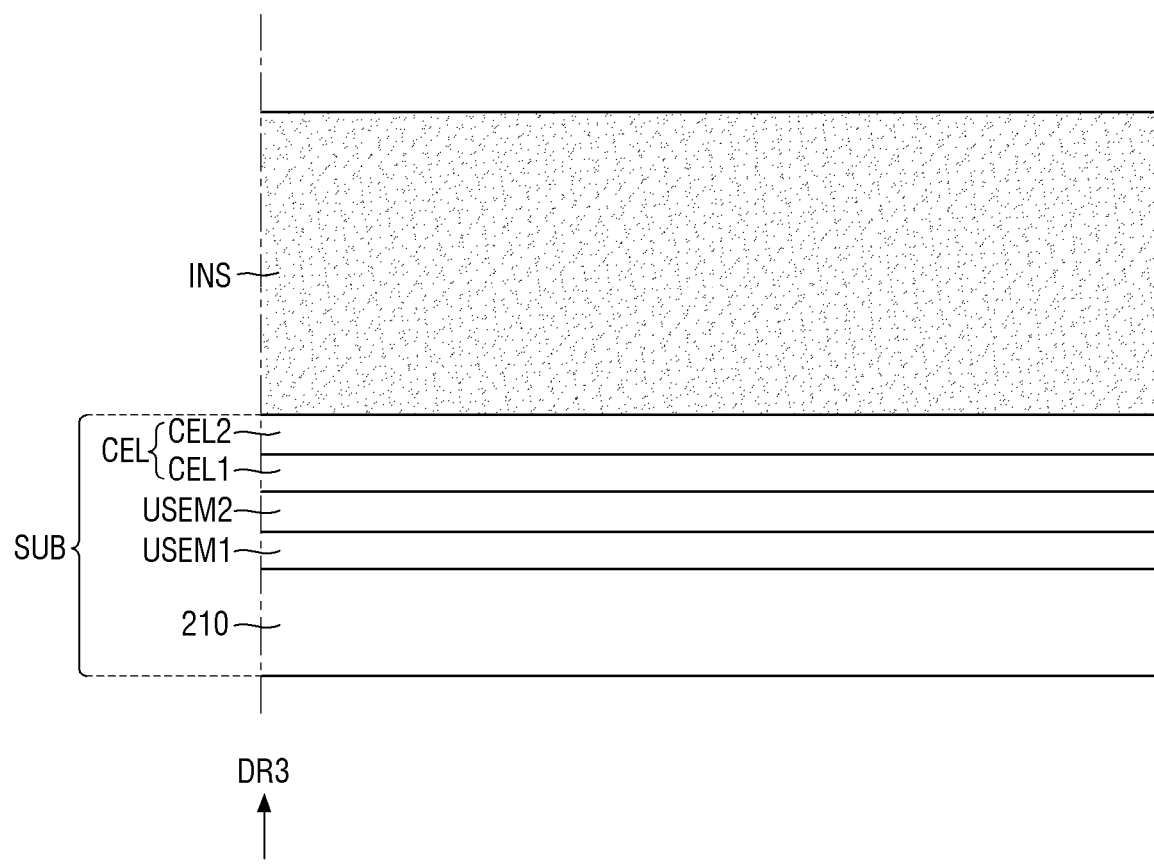

Next, referring to FIG. 10, a hard mask INS is formed on the common electrode layer CEL of the base substrate SUB (S40).

The hard mask INS may be entirely on the common electrode layer CEL. The hard mask INS may include an insulating material such as silicon oxide ($SiO_x$), silicon nitride ($SiN_x$), silicon oxynitride ($SiO_xN_y$), and/or the like, and may serve as a mask of (e.g., during) a process of forming the light emitting elements LE. As described above, the hard mask INS may be the emission defining film INS which defines the light emitting elements LE.

Figure 11:
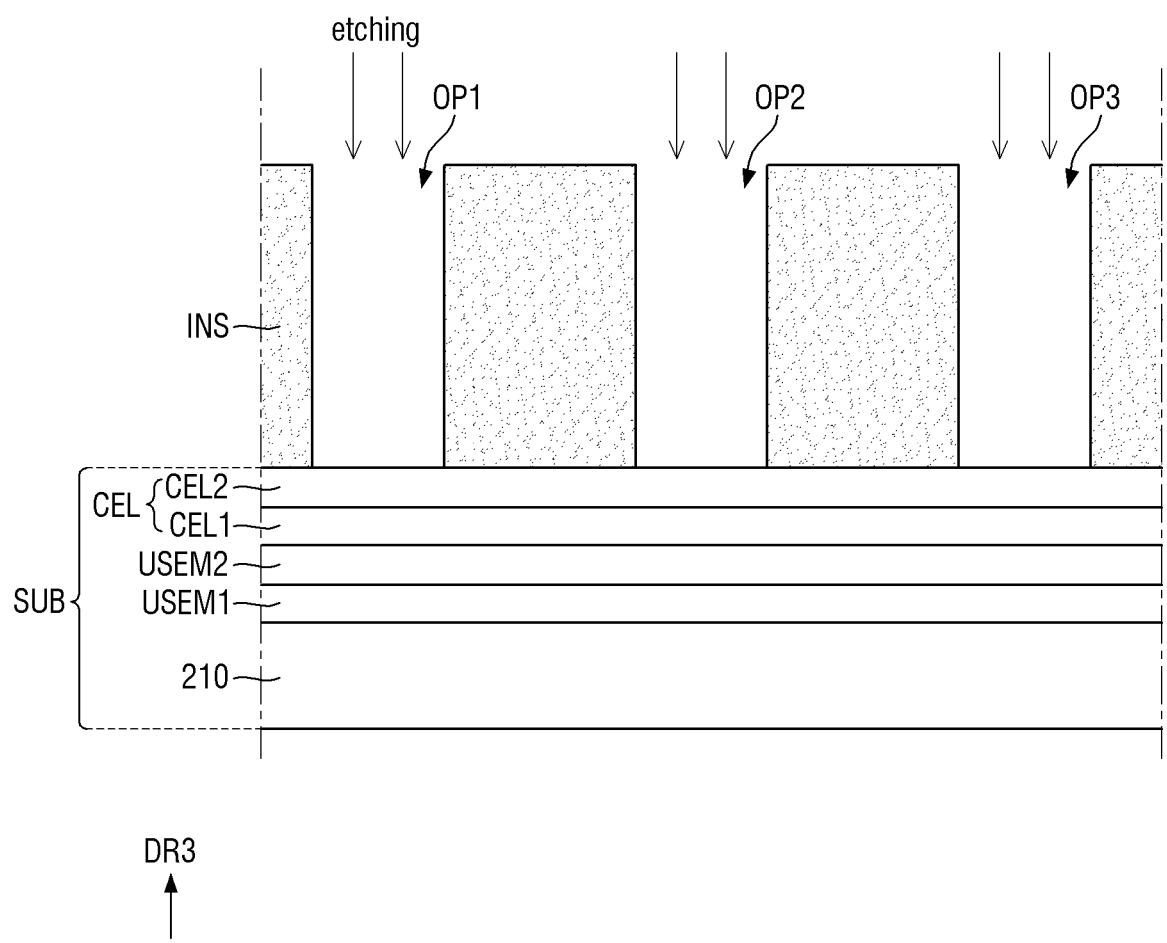

Subsequently, referring to FIG. 11, the openings OP1, OP2, and OP3 passing through the hard mask INS are formed (S40). The forming of the openings OP1, OP2, and OP3 passing through the hard mask INS (S40) may be performed through etching.

Figure 12:
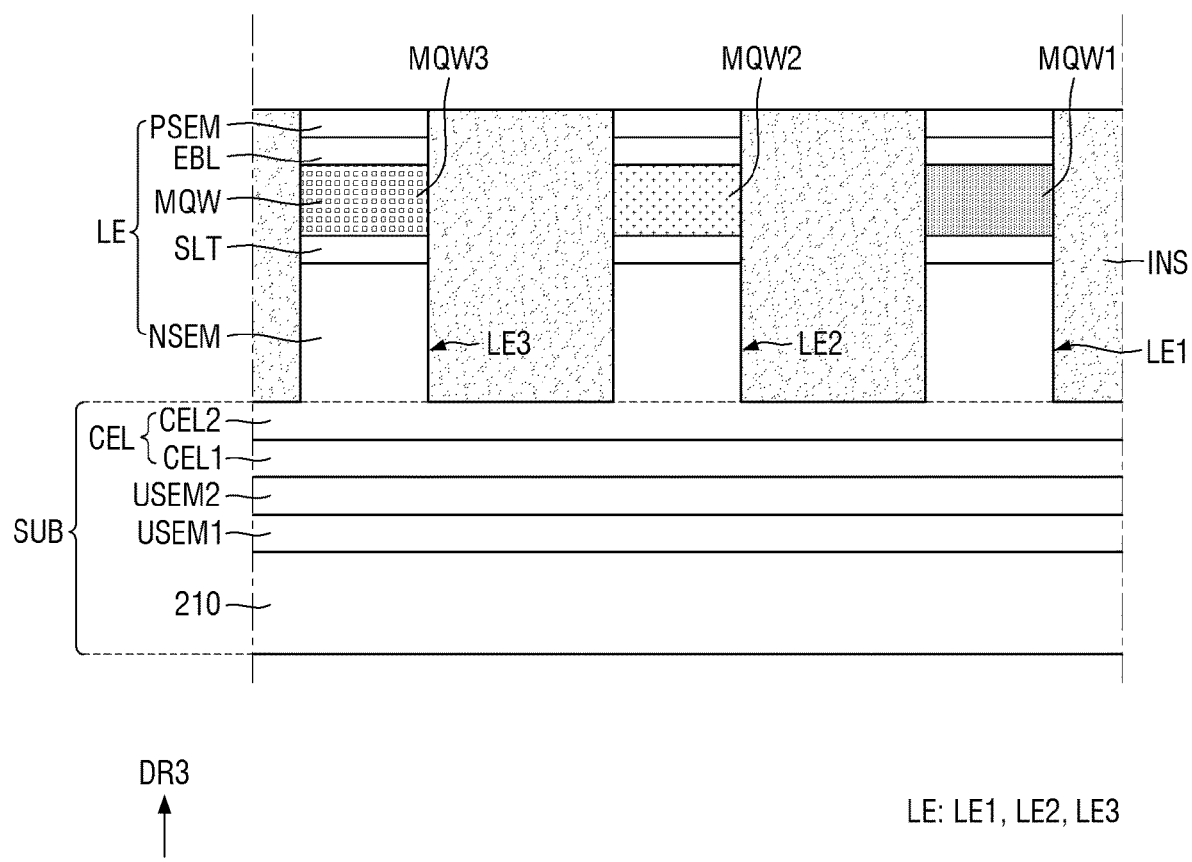

Subsequently, as shown in FIG. 12, the light emitting elements LE1, LE2, and LE3 are formed (S50).

The process of forming the light emitting elements LE1, LE2, and LE3 may be performed through an epitaxial growth method like the process of forming the undoped semiconductor layers USEM1 and USEM2 and the common electrode layer CEL.

In one or more embodiments, the light emitting elements LE1, LE2, and LE3 are formed by sequentially growing a superlattice layer SLT, the respective active layers MQW1, MQW2, and MQW3, an electron blocking layer EBL, and a first semiconductor layer PSEM.

In some embodiments, the porous density (e.g.; porosity) of the undoped semiconductor layers USEM1 and USEM2 overlapping the active layers MQW1, MQW2, and MQW3 may be different from each other. For example, the porous density of the undoped semiconductor layers USEM1 and USEM2 overlapping the first active layer MQW1 may be the largest, the porous density of the undoped semiconductor layers USEM1 and USEM2 overlapping the second active layer MQW2 may be the next largest, and the porous density of the undoped semiconductor layers USEM1 and USEM2 overlapping the third active layer MQW3 may be the smallest. In some other embodiments, the porous density of the undoped semiconductor layers USEM1 and USEM2 overlapping the first active layer MQW1 may be the largest, and the porous density of the undoped semiconductor layers USEM1 and USEM2 overlapping the second active layer MQW2 and the porous density of the undoped semiconductor layers USEM1 and USEM2 overlapping the third active layer MQW3 may be the same.

Figure 13:
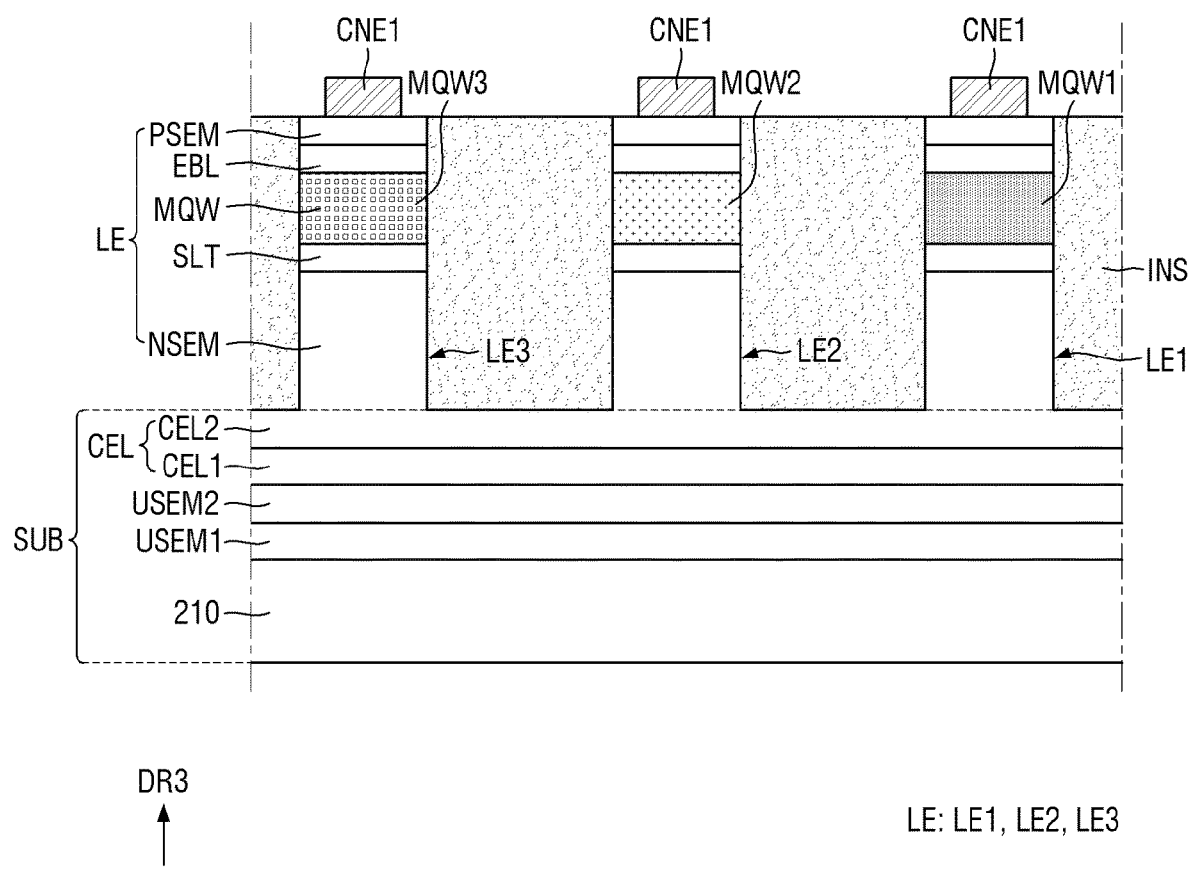

Subsequently, as shown in FIG. 13, first connection electrodes CNE1 are formed on the light emitting elements LE.

The first connection electrodes CNE1 may be formed on the light emitting elements LE1, LE2, and LE3 through a photolithography process.

The display substrate 200 arranged on the second substrate 210 may be fabricated through the above-described processes. Subsequently, the display device 1 may be fabricated by bonding the semiconductor circuit substrate 100 and the display substrate 200.

Figure 14:
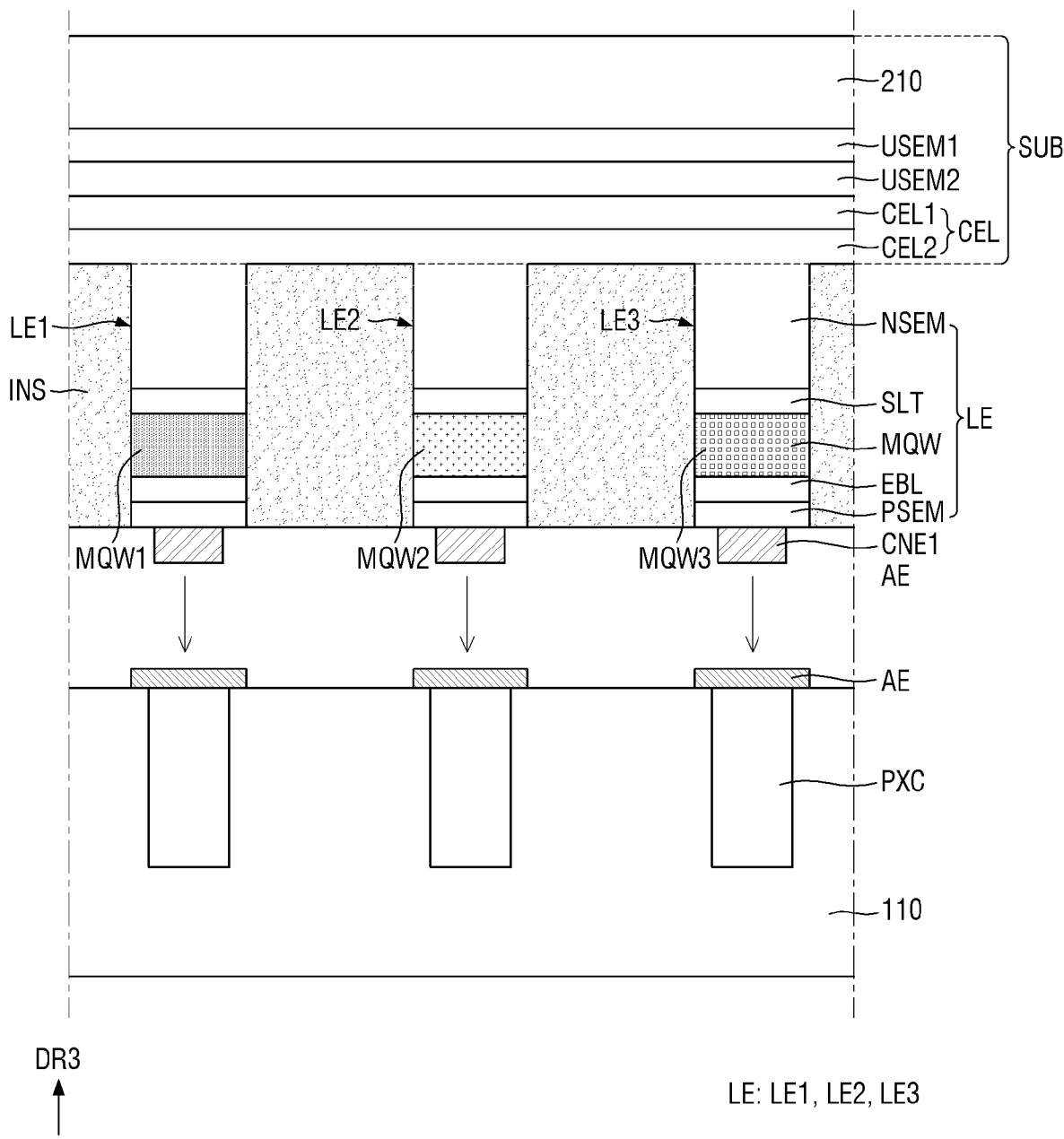

As shown in FIG. 14, the base substrate SUB, on which the light emitting elements LE defined by the hard mask INS are formed, and the semiconductor circuit substrate 100 are placed (S60) and bonded.

The semiconductor circuit substrate 100 includes a first substrate 110 including pixel circuit parts PXC, and the pixel electrodes AE formed on one surface of the first substrate 110. The second substrate 210 and the display substrate 200 may be aligned on the semiconductor circuit substrate 100 so that the light emitting elements LE may correspond to the pixel electrodes AE of the semiconductor circuit substrate 100. The first connection electrodes CNE1 may be aligned to overlap the pixel electrodes AE in the thickness direction.

When the second substrate 210 and the display substrate 200 are aligned with the semiconductor circuit substrate 100, a filling layer 500 is provided therebetween to bond the display substrate 200 and the semiconductor circuit substrate 100. For example, in the filling layer 500, when the display substrate 200 and the semiconductor circuit substrate 100 are aligned and thus the first connection electrodes CNE1 come into contact with the pixel electrodes AE, a material of the filling layer 500 may be injected to fill a space between the display substrate 200 and the semiconductor circuit substrate 100. Hereinafter, when the injected material of the filling layer 500 is cured, the display substrate 200 and the semiconductor circuit substrate 100 may be bonded to each other. However, the present disclosure is not limited thereto.

The first connection electrodes CNE1 provided on the light emitting elements LE of the display substrate 200 may come into direct contact with the pixel electrodes AE. When the semiconductor circuit substrate 100 and the display substrate 200 are bonded to each other, both ends of each of the light emitting elements LE may be electrically connected to the pixel circuit part PXC of the semiconductor circuit substrate 100.

Figure 15:
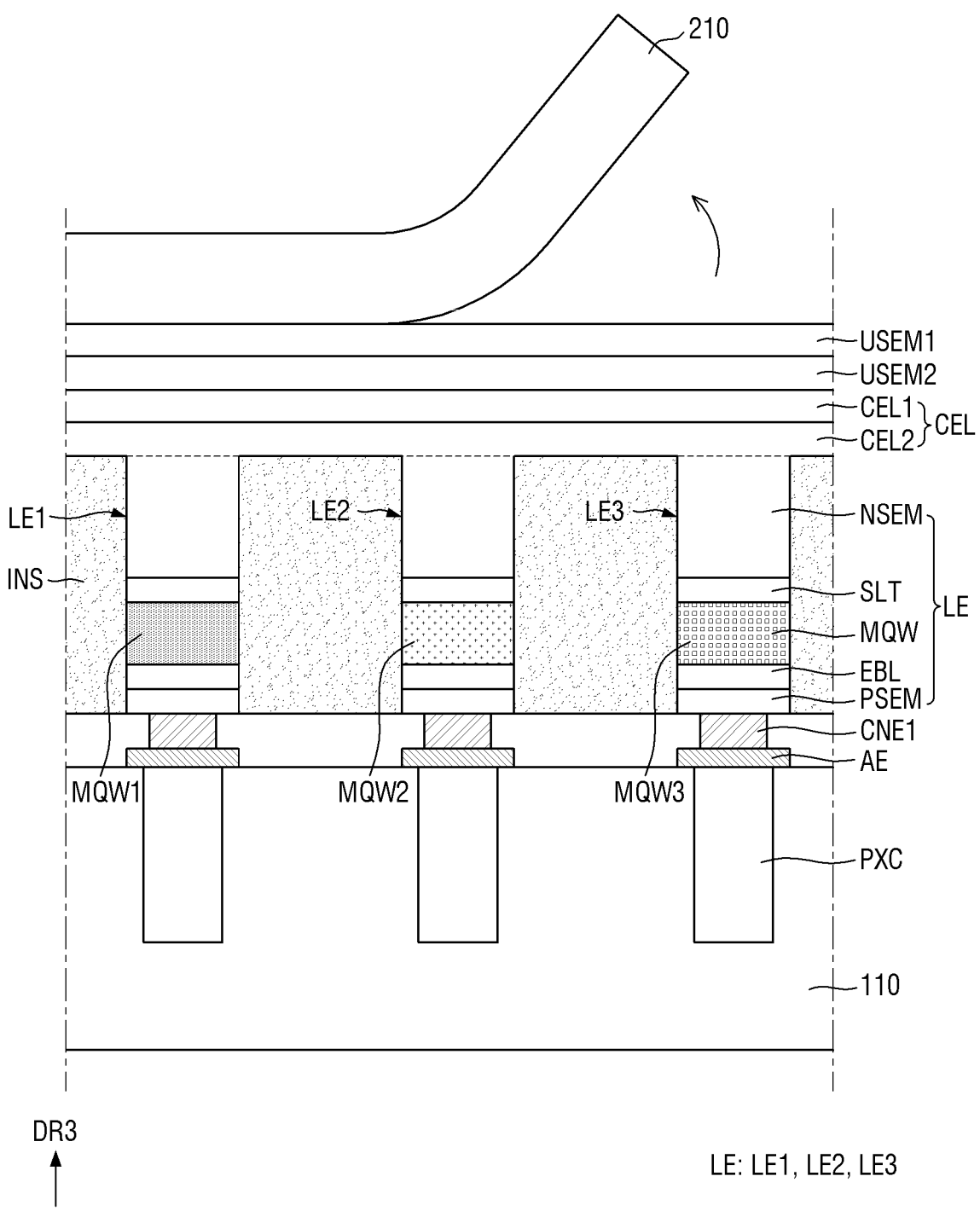
Figure 16:
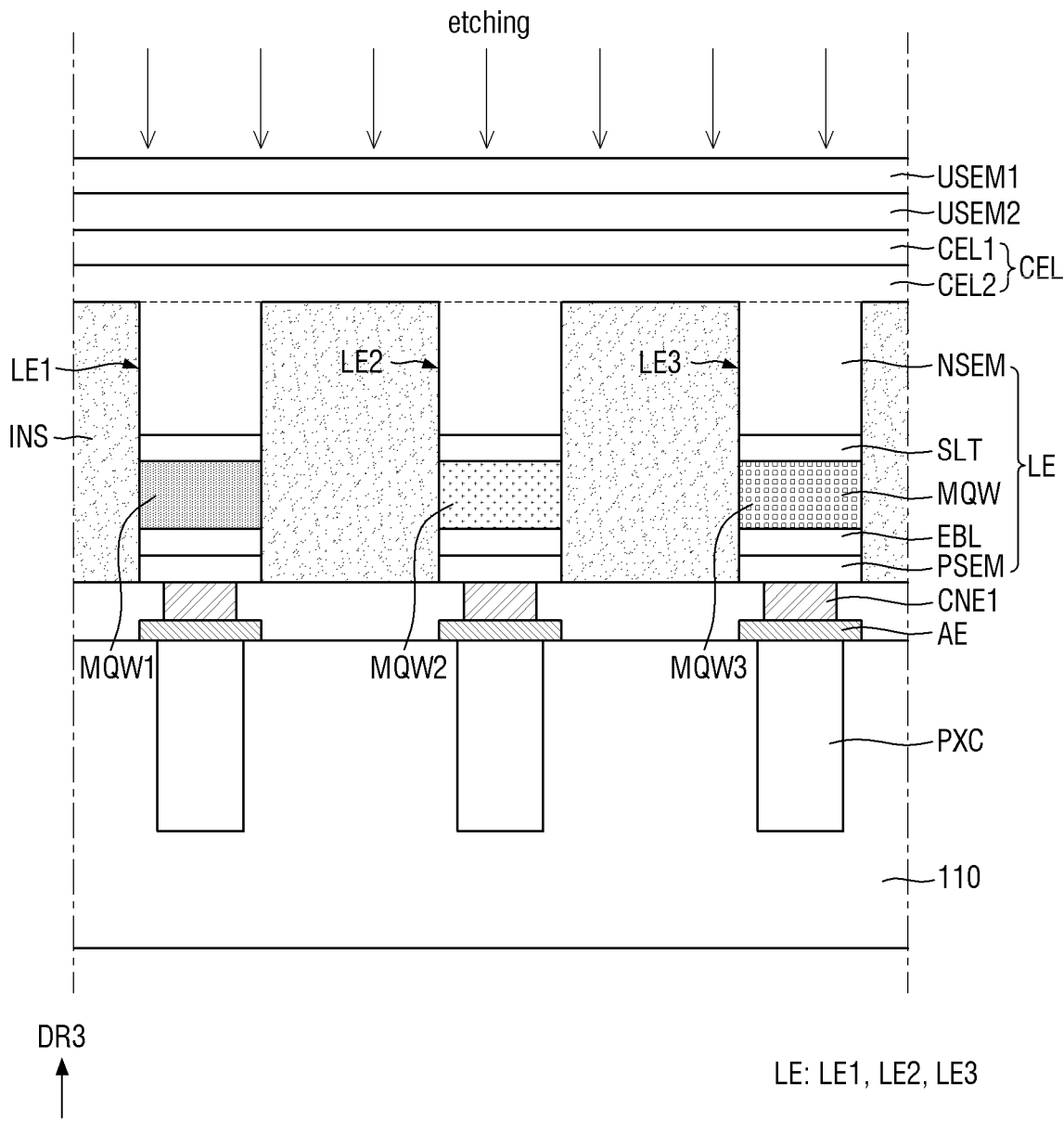
Figure 17:
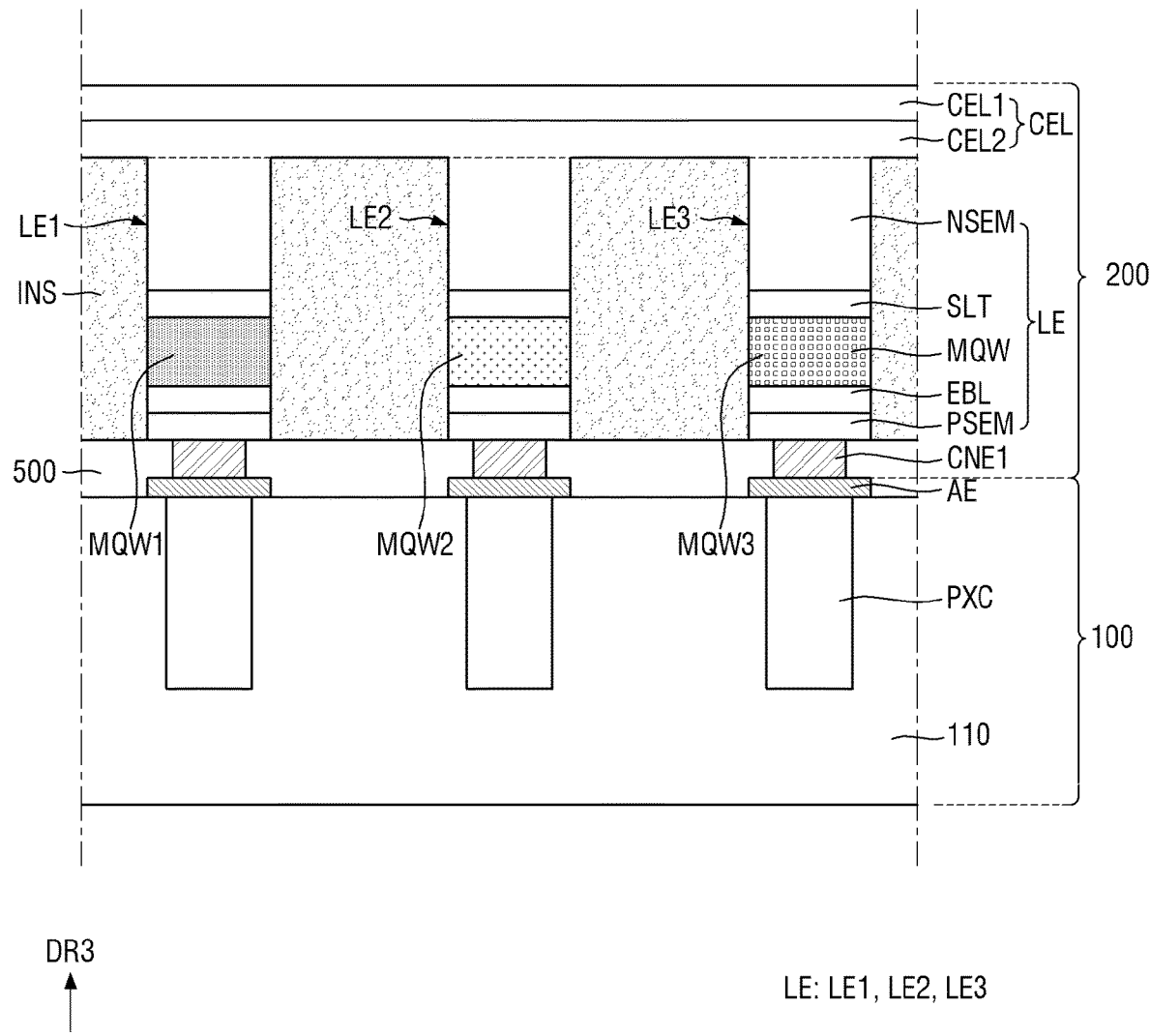

Next, as shown in FIGS. 15 to 17, the display device 1 may be fabricated by removing the second substrate 210 arranged on the undoped semiconductor layers USEM of the display substrate 200, and removing the undoped semiconductor layers USEM1 and USEM2 through an etching process.

In the method of fabricating the display device according to one or more embodiments, after forming the first undoped semiconductor layer USEM1 on the second substrate 210, and then forming the second undoped semiconductor layer USEM2 having a larger lattice constant than the first undoped semiconductor layer USEM1 on the first undoped semiconductor layer USEM1, the common electrode layer CEL is formed on the second undoped semiconductor layer USEM2. Accordingly, the lattice constant of the common electrode layer CEL may increase, and thus, in the process of growing the light emitting elements LE1, LE2, LE3, the inner defects which may occur in the process of growing the first active layer MQW1 may be minimized or reduced by minimizing or reducing a difference in lattice constant between the first active layer MQW1 and the common electrode layer CEL.

Figure 18:
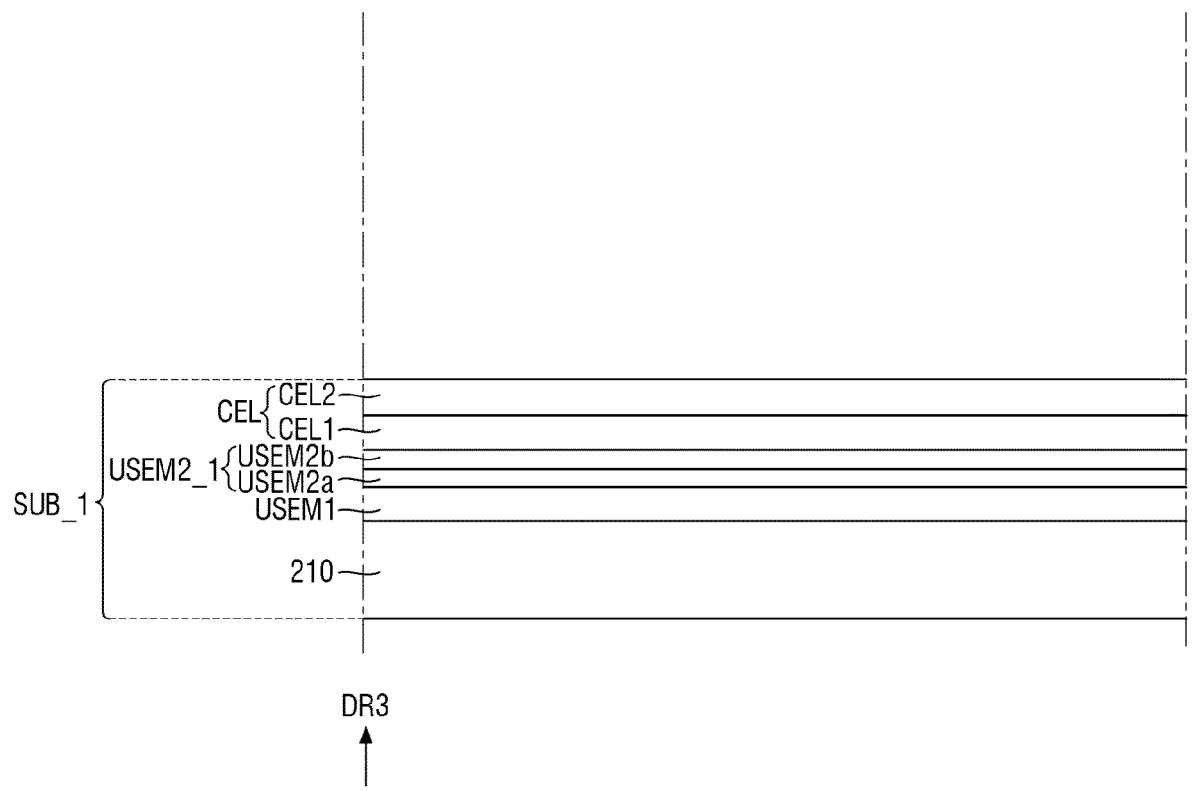
FIG. 18 is a cross-sectional view for describing one process operation (e.g., an act) of a method of fabricating a display device according to one or more other embodiments.

FIG. 18 is a cross-sectional view for describing one process operation (e.g., act) of a method of fabricating a display device according to one or more other embodiments.

Referring to FIG. 18, according to the present embodiments, a method of preparing a base substrate SUB_1 in which an undoped semiconductor layer is formed on a second substrate 210 and a common electrode layer CEL is formed on the undoped semiconductor layer, is different from the method of fabricating the display device according to FIGS. 8 to 17 in that a second undoped semiconductor layer USEM2_1 of the undoped semiconductor layer may include two or more layers having different lattice constants.

According to the present embodiments, the second undoped semiconductor layer USEM2_1 may include a first sub-semiconductor layer USEM2a and a second sub-semiconductor layer USEM2b having different lattice constants. The first sub-semiconductor layer USEM2a may be between a first undoped semiconductor layer USEM1 and the second sub-semiconductor layer USEM2b, and the second sub-semiconductor layer USEM2b may be between the first sub-semiconductor layer USEM2a and a first common electrode layer CEL1. The lattice constant of the second sub-semiconductor layer USEM2b may be larger than the lattice constant of the first sub-semiconductor layer USEM2a. For example, the second undoped semiconductor layer USEM2_1 may be designed to have a lattice constant which increases as the second undoped semiconductor layer USEM2_1 approaches the common electrode layer CEL.

Because the lattice constant of the semiconductor layer may be adjusted by the density of porous materials in the corresponding semiconductor layer, and the lattice constant of the semiconductor layer increases in proportion to the density as the density of the porous materials in the semiconductor layer increases, the second sub-semiconductor layer USEM2b may have a porosity density (e.g., porosity) larger than that of the first sub-semiconductor layer USEM2a.

For convenience of explanation, FIG. 18 illustrates only two layers of the second undoped semiconductor layer USEM2_1 having different lattice constants, but the present disclosure is not limited thereto, and the second undoped semiconductor layer USEM2_1 may include three or more layers having different lattice constants. Even in this case, the lattice constant may decrease from the layer closest to the common electrode layer CEL to the layer most distant from the common electrode layer CEL (the porosity density changes in proportion to the lattice constant).

Figure 19:
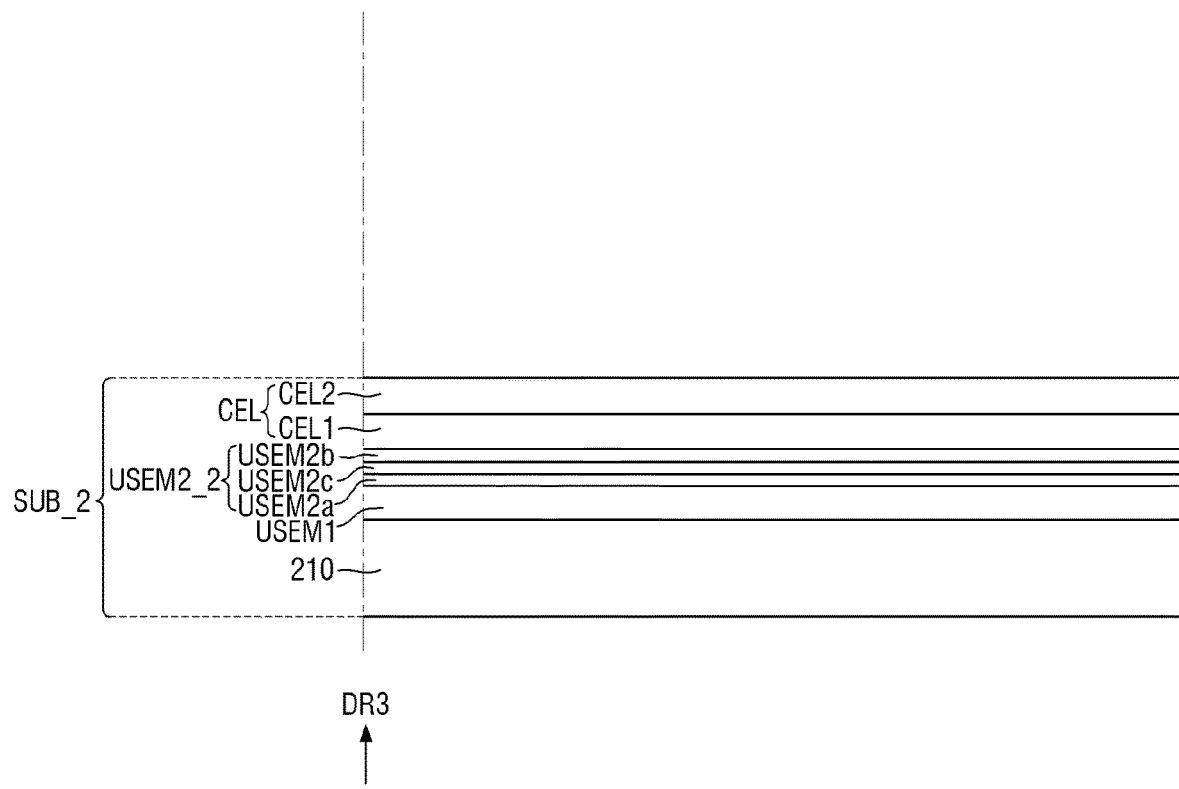
FIG. 19 is a cross-sectional view for describing one process operation (e.g., an act) of a method of fabricating a display device according to one or more other embodiments.

FIG. 19 is a cross-sectional view for describing one process operation (e.g., act) of a method of fabricating a display device according to one or more other embodiments.

Referring to FIG. 19, it is different from the embodiment according to FIG. 18 in that a second undoped semiconductor layer USEM2_2 of a base substrate SUB_2 according to the present embodiment further includes a third sub-semiconductor layer USEM2c between a first sub-semiconductor layer USEM2a and a second sub-semiconductor layer USEM2b.

A lattice constant of the third sub-semiconductor layer USEM2c may have a value between a lattice constant of the first sub-semiconductor layer USEM2a and a lattice constant of the second sub-semiconductor layer USEM2b.

In the present embodiments, the lattice constant of the first sub-semiconductor layer USEM2a may be smaller than that of the second sub-semiconductor layer USEM2b, but the present disclosure is not limited thereto and the lattice constants may be the same.

As described above, because the lattice constant of the semiconductor layer may be adjusted by the density of porous materials in the corresponding semiconductor layer, and the lattice constant of the semiconductor layer increases in proportion to the density as the density of the porous materials in the semiconductor layer increases, a porosity density (e.g., porous density or porosity) of the third sub-semiconductor layer USEM2c may have a value between a porous density of the first sub-semiconductor layer USEM2a and a porous density of the second sub-semiconductor layer USEM2b.

Figure 20:
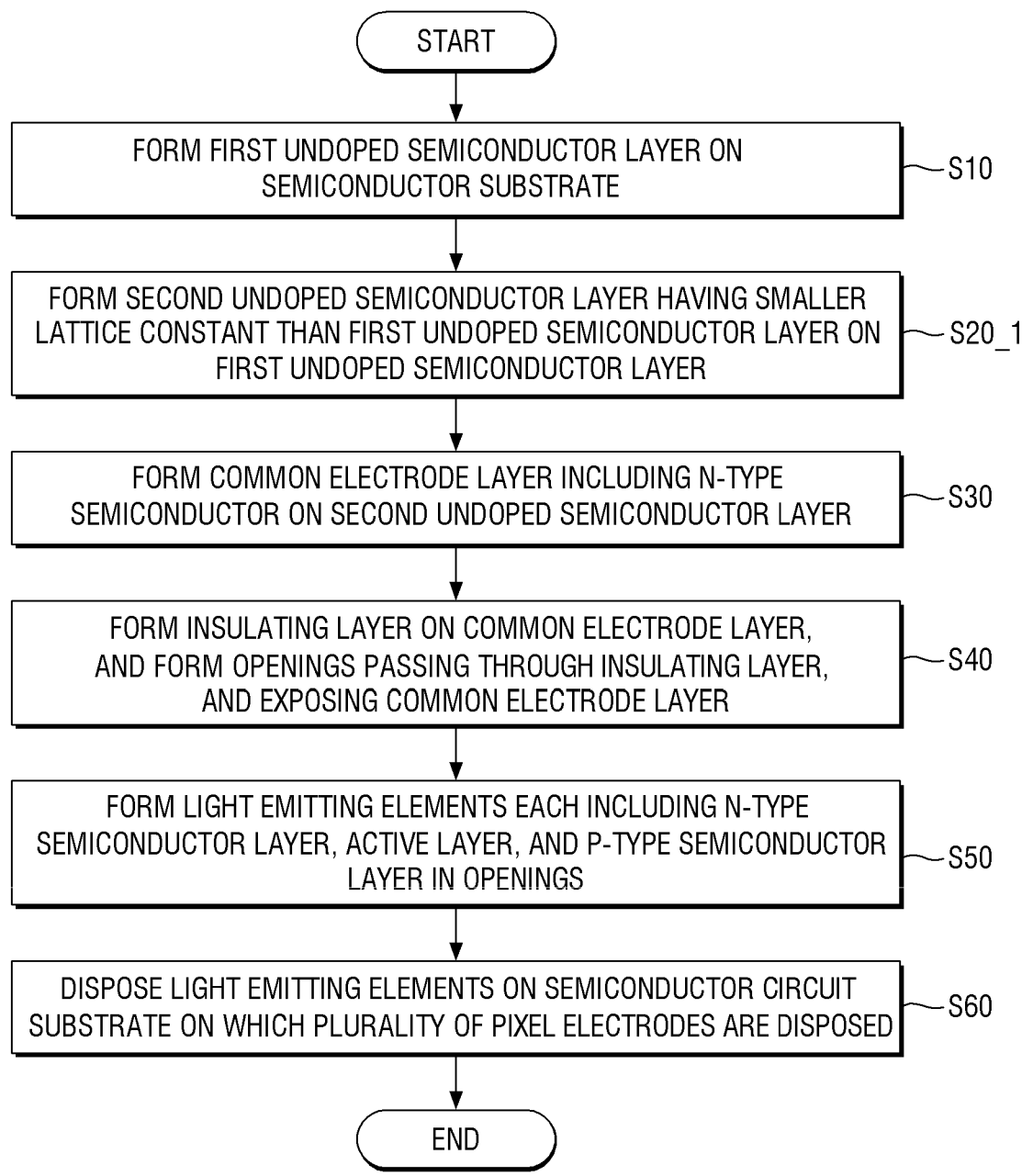
FIG. 20 is a flow chart illustrating the method of fabricating a display device according to one or more other embodiments.
Figure 21:
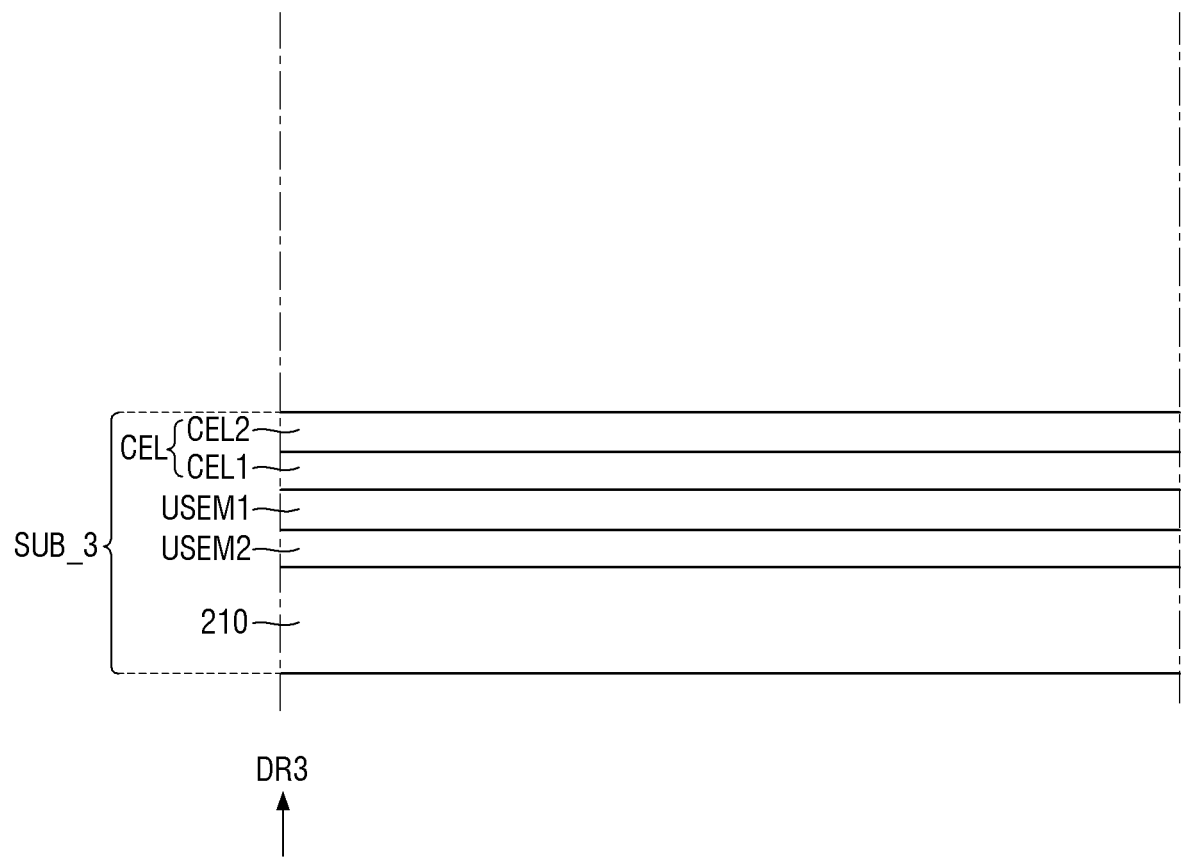
FIG. 21 is a cross-sectional view for describing one process operation (e.g., an act) of a method of fabricating a display device according to one or more other embodiments.

FIG. 20 is a flow chart illustrating the method of fabricating a display device according to one or more other embodiments. FIG. 21 is a cross-sectional view for describing one process operation (e.g. act) of a method of fabricating a display device according to one or more other embodiments.

Referring to FIGS. 20 and 21, the method of fabricating a display device according to the present embodiments is different from the embodiments according to FIGS. 8 to 17 in that a second undoped semiconductor layer USEM2 is formed on a second substrate 210 first, and then a first undoped semiconductor layer USEM1 having a smaller lattice constant than the second undoped semiconductor layer USEM2 is formed (S20_1) in an operation of preparing a base substrate SUB_3.

Because descriptions of other same or similar elements have been provided above in FIGS. 8 to 17, redundant descriptions thereof will not be provided.

Figure 22:
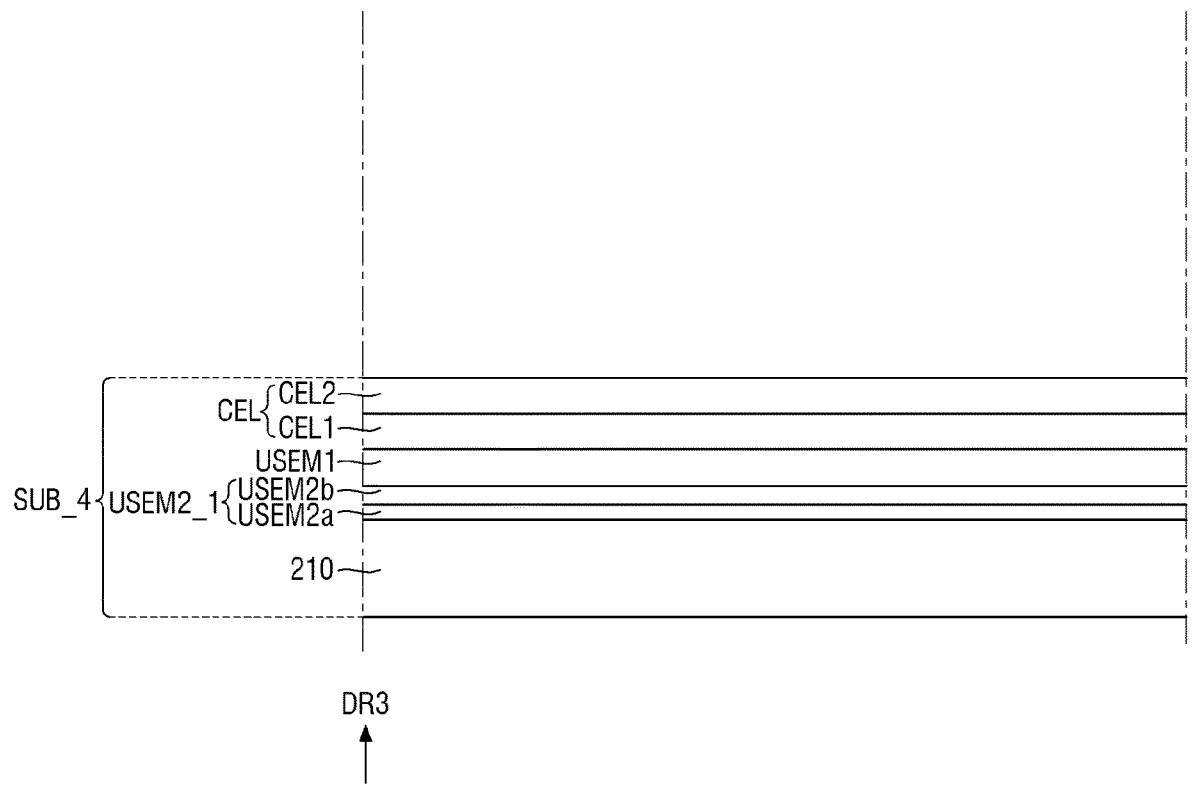
FIG. 22 is a cross-sectional view for describing one process operation (e.g., an act) of a method of fabricating a display device according to one or more other embodiments.

FIG. 22 is a cross-sectional view for describing one process operation (e.g., act) of a method of fabricating a display device according to one or more other embodiments.

Referring to FIG. 22, it is different from the embodiments according to FIG. 21 in that the second undoped semiconductor layer USEM2_1 described above in FIG. 18 is applied in an operation of preparing a base substrate SUB_4 according to the present embodiments.

Because descriptions of other same or similar elements have been provided above in FIGS. 18 and 21, redundant descriptions thereof will not be provided.

Figure 23:
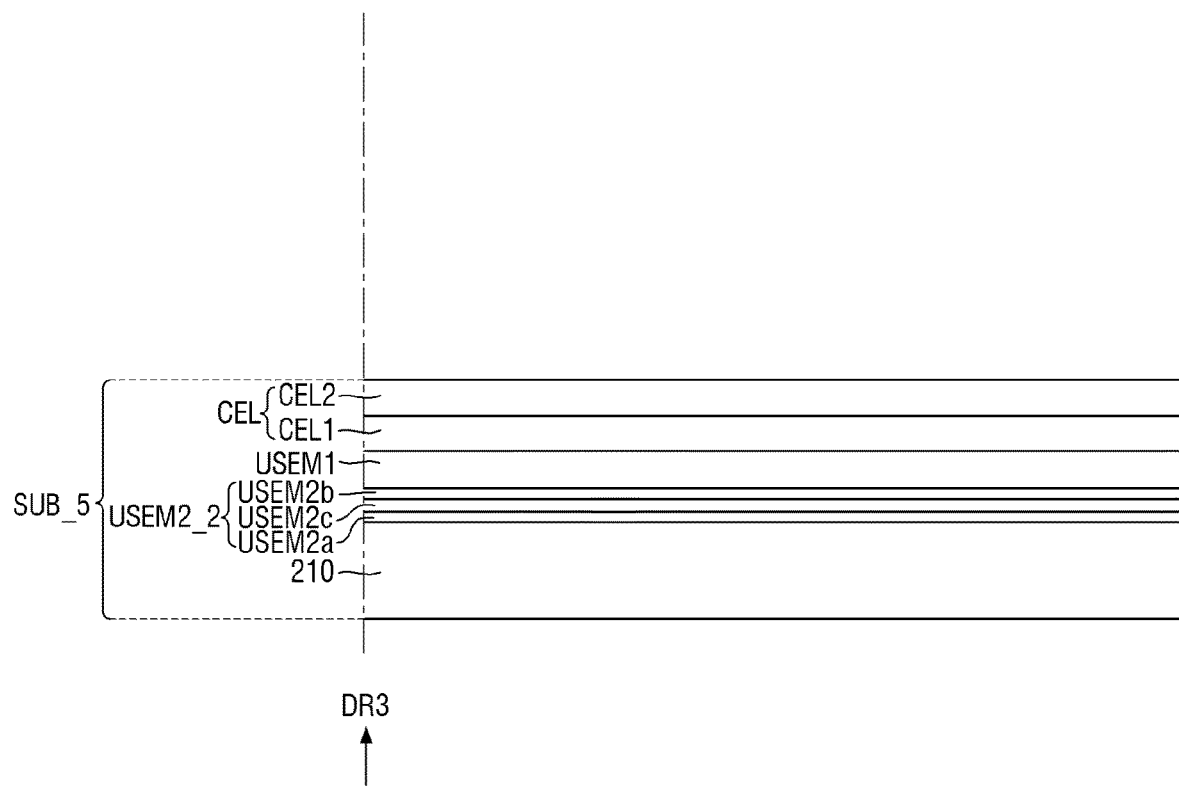
FIG. 23 is a cross-sectional view for describing one process operation (e.g., an act) of a method of fabricating a display device according to one or more other embodiments.

FIG. 23 is a cross-sectional view for describing one process operation of a method of fabricating a display device according to one or more other embodiments.

Referring to FIG. 23, it is different from the embodiments according to FIG. 22 in that the second undoped semiconductor layer USEM2_2 described above in FIG. 19 is applied in an operation of preparing a base substrate SUB_5 according to the present embodiments.

Because descriptions of the same or similar elements have been provided above in FIGS. 19 and 22, redundant descriptions thereof will not be provided.

Figure 24:
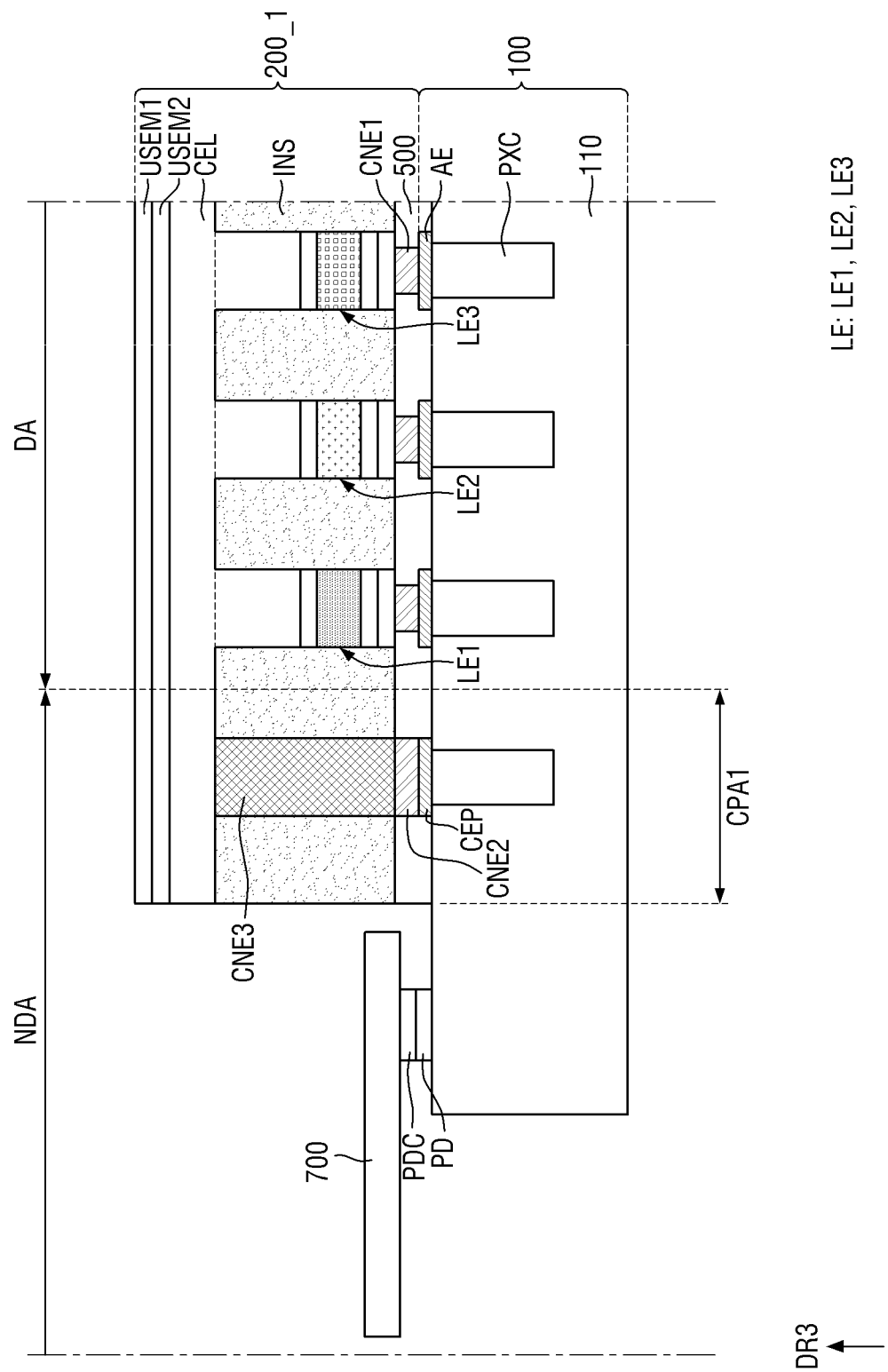
FIGS. 24 and 25 are cross-sectional views of a display device according to one or more other embodiments.
Figure 25:
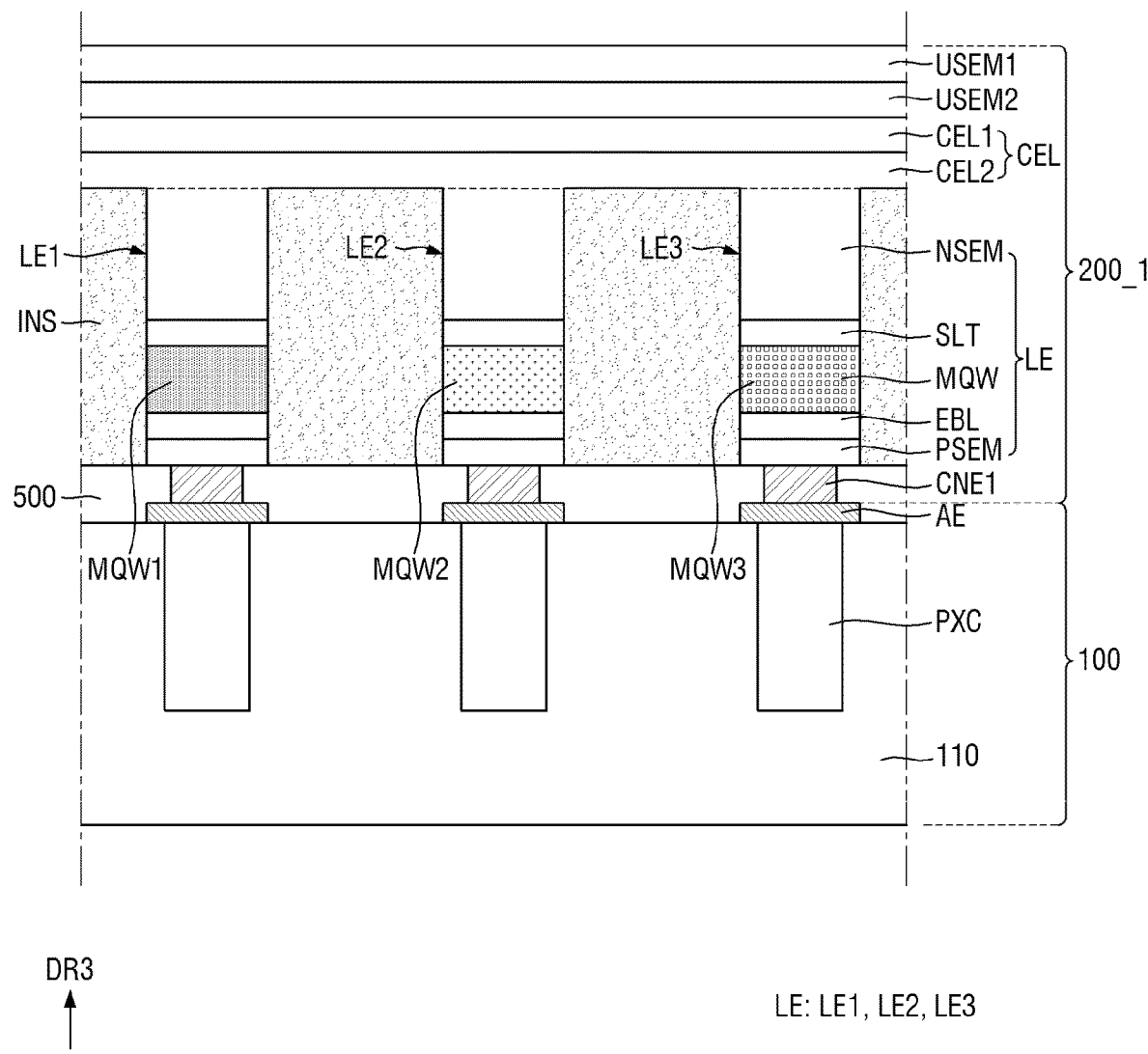

FIGS. 24 and 25 are cross-sectional views of a display device according to one or more other embodiments.

Referring to FIGS. 24 and 25, a display substrate 200_1 of the display device according to the present embodiments is different from the display device 1 according to FIGS. 5 and 6 in that a first undoped semiconductor layer USEM1, and the second undoped semiconductor layer USEM2 on the first undoped semiconductor layer USEM1 are further provided on a common electrode layer CEL.

The display device according to the present embodiments may be fabricated by a fabricating process in which the process of removing the undoped semiconductor layers USEM1 and USEM2 of the method of fabricating the display device described above in FIG. 16 is omitted (e.g., is not taken).

Because descriptions of the same or similar elements have been provided above in FIGS. 5 and 6, redundant descriptions thereof will not be provided.

Figure 26:
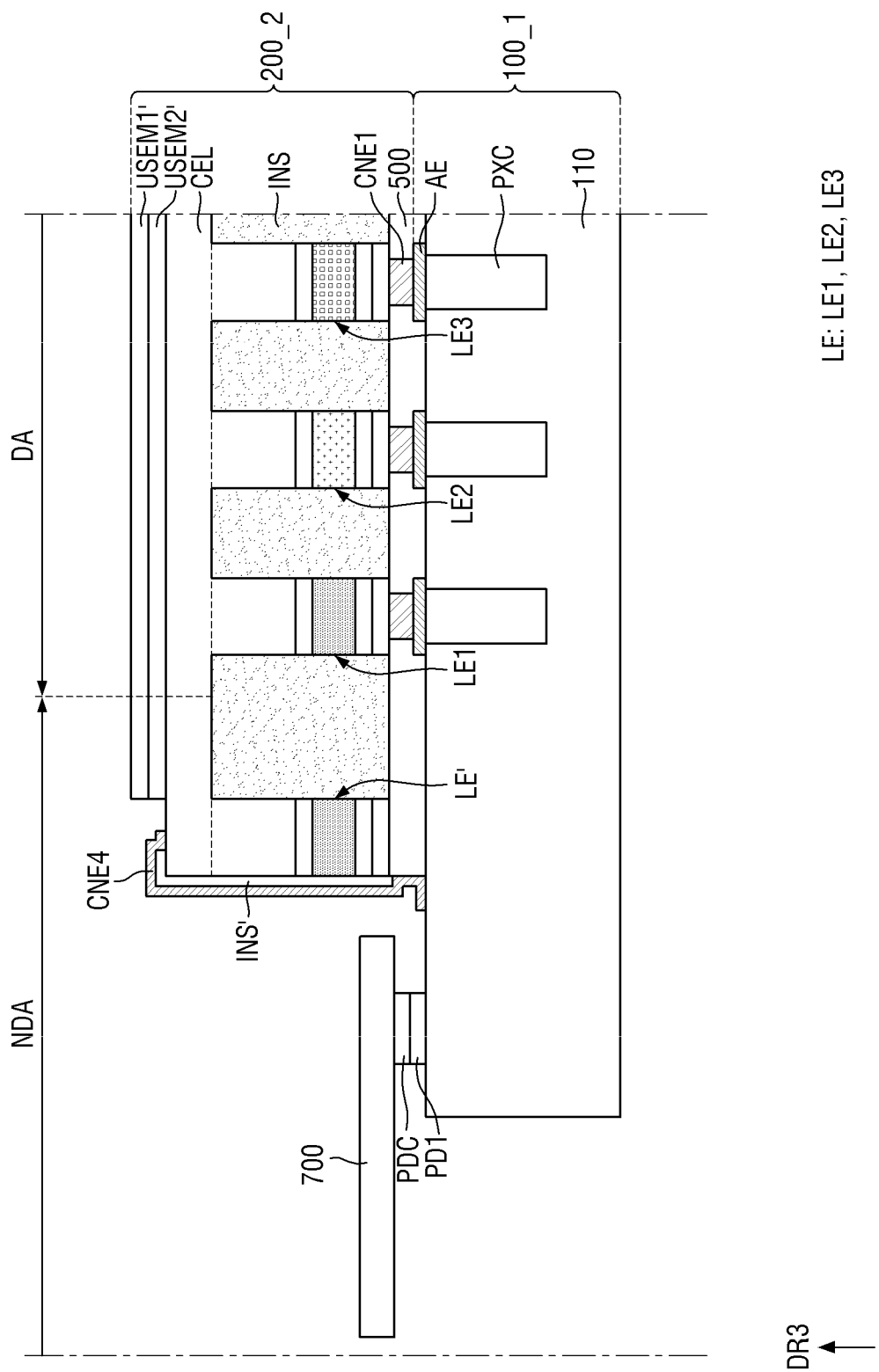
FIG. 26 is a cross-sectional view of a display device according to one or more other embodiments.

FIG. 26 is a cross-sectional view of a display device according to one or more other embodiments.

Referring to FIG. 26, the display device according to the present embodiments is different from the display device according to FIG. 5 in that portions of undoped semiconductor layers USEM1' and USEM2' on the non-display region NDA are removed, a dummy light emitting element LE' at the same (or similar) position as the light emitting elements LE1, LE2, and LE3 is further provided on the non-display region NDA, a fourth connection electrode CNE4 is provided to extend from an upper end surface of the common electrode layer CEL, the common electrode layer CEL overlapping the dummy light emitting element LE', and around a side surface of the common electrode layer CEL, a side surface of the dummy light emitting element LE', a side surface of the filling layer 500, and an upper surface of the first substrate 110 is further included, and the fourth connection electrode CNE4 further includes an insulating layer INS' which connects the common electrode layer CEL and the pad PD, and caps the dummy light emitting element LE' at an exposed side surface.

In some embodiments, a first connection electrode may be formed under the dummy light emitting element LE' like other light emitting elements LE1, LE2, and LE3, and a pixel electrode overlapping the first connection electrode may be further provided. In this case, the above-described insulating layer INS' may perform a function of preventing or reducing the risk of a short circuit between the common electrode layer CEL and the pixel electrode. When the above-described first connection electrode and the pixel electrode are omitted, the insulating layer INS' may also be omitted.

Figure 27:
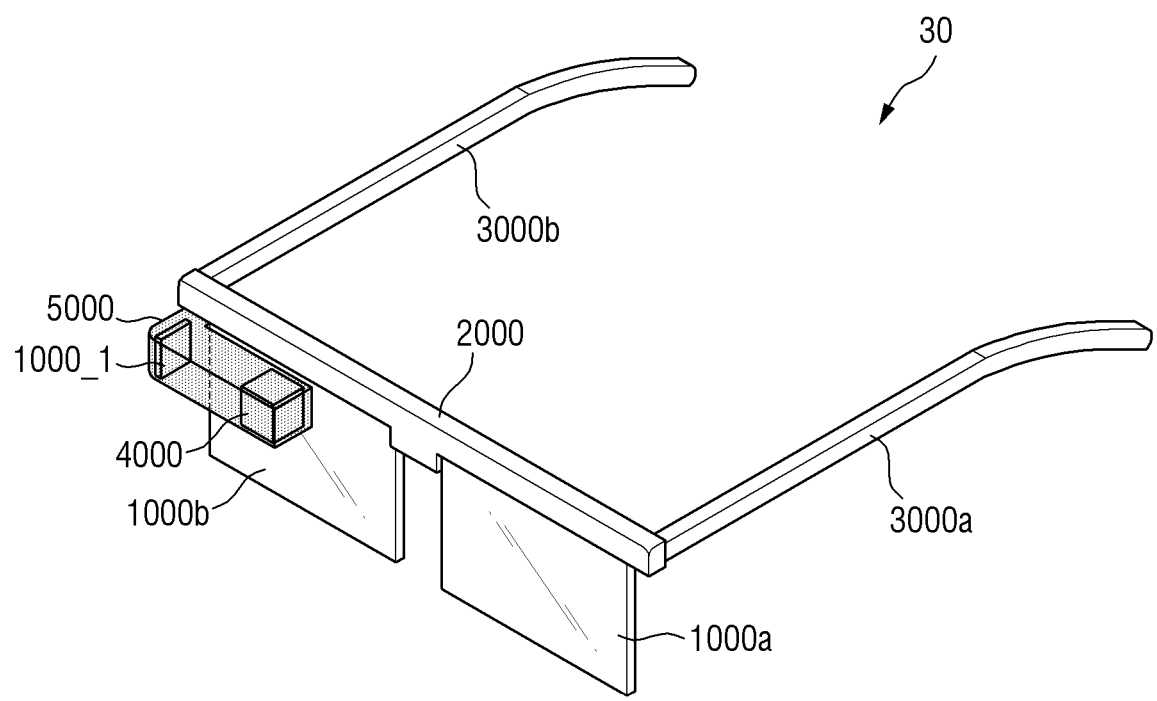
FIG. 27 is a perspective view illustrating a virtual reality device including the display device according to one or more embodiments.

FIG. 27 is an example view illustrating a virtual reality device including a display device according to one or more embodiments. FIG. 27 illustrates a virtual reality device 30 to which a display device 1000_1 according to one or more embodiments is applied.

Referring to FIG. 27, the virtual reality device 30 according to one or more embodiments may be a glasses-type device (e.g., a device akin to glasses). The virtual reality device 30 according to one or more embodiments may include the display device 1000_1, a left eye lens 1000a, a right eye lens 1000b, a support frame 2000, glasses frame legs 3000a and 3000b, a reflective member 4000, and a display device accommodation part 5000.

FIG. 27 illustrates the virtual reality device 30 including the glasses frame legs 3000a and 3000b, but the virtual reality device 30 according to one or more embodiments may also be applied to a head mounted display including a head mounted band which may be mounted on a head instead of the glasses frame legs 3000a and 3000b. For example, the virtual reality device 30 according to one or more embodiments is not limited to that illustrated in FIG. 27, and may be applied to various other suitable electronic devices in various other suitable forms.

The display device accommodation part 5000 may include the display device 1000_1 and the reflective member 4000. An image displayed on the display device 10001 may be reflected by the reflective member 4000 and provided to a user's right eye through the right eye lens 1000b. Accordingly, the user may view a virtual reality image displayed on the display device 1000_1 through the right eye.

In FIG. 27, although an example in which the display device accommodation part 5000 is positioned at a right end of the support frame 2000 is described, the embodiments of the specification are not limited thereto. For example, the display device accommodation part 5000 may be positioned at a left end of the support frame 2000. In this case, the image displayed on the display device 1000_1 may be reflected by the reflective member 4000 and provided to a user's left eye through the left eye lens 1000a. Accordingly, the user may view the virtual reality image displayed on the display device 1000_1 through the left eye. In one or more embodiments, the display device accommodation part 5000 may be positioned at both the left and right ends of the support frame 2000, and in this case, the user may view the virtual reality image displayed on the display device 1000_1 through both the left and right eyes.

Figure 28:
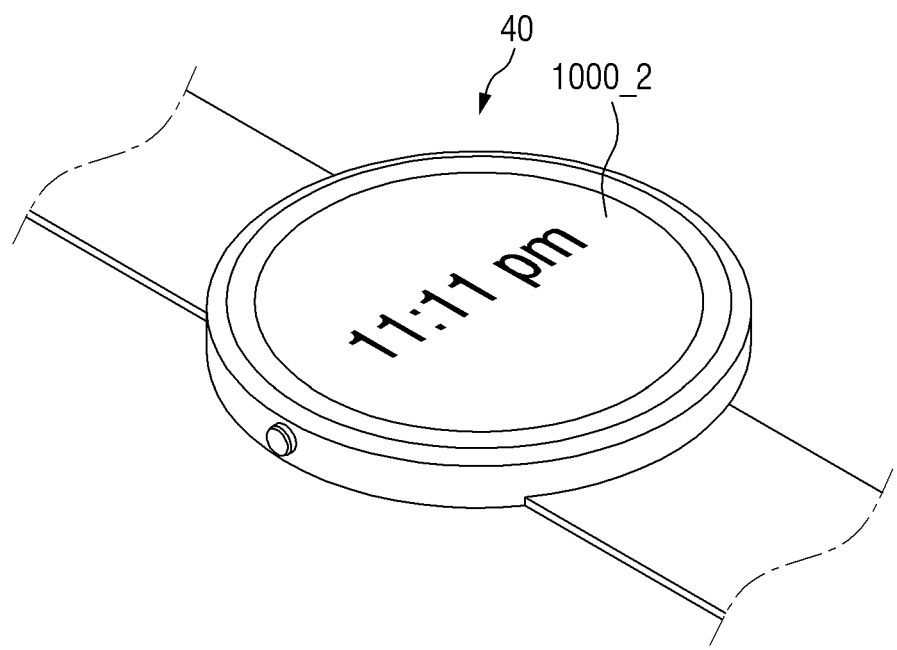
FIG. 28 is a perspective view illustrating a smart device including the display device according to one or more embodiments.

FIG. 28 is an example view illustrating a smart device including the display device according to one or more embodiments.

Referring to FIG. 28, a display device 1000_2 according to one or more embodiments may be applied to a smart watch 40 which is one of smart devices.

Figure 29:
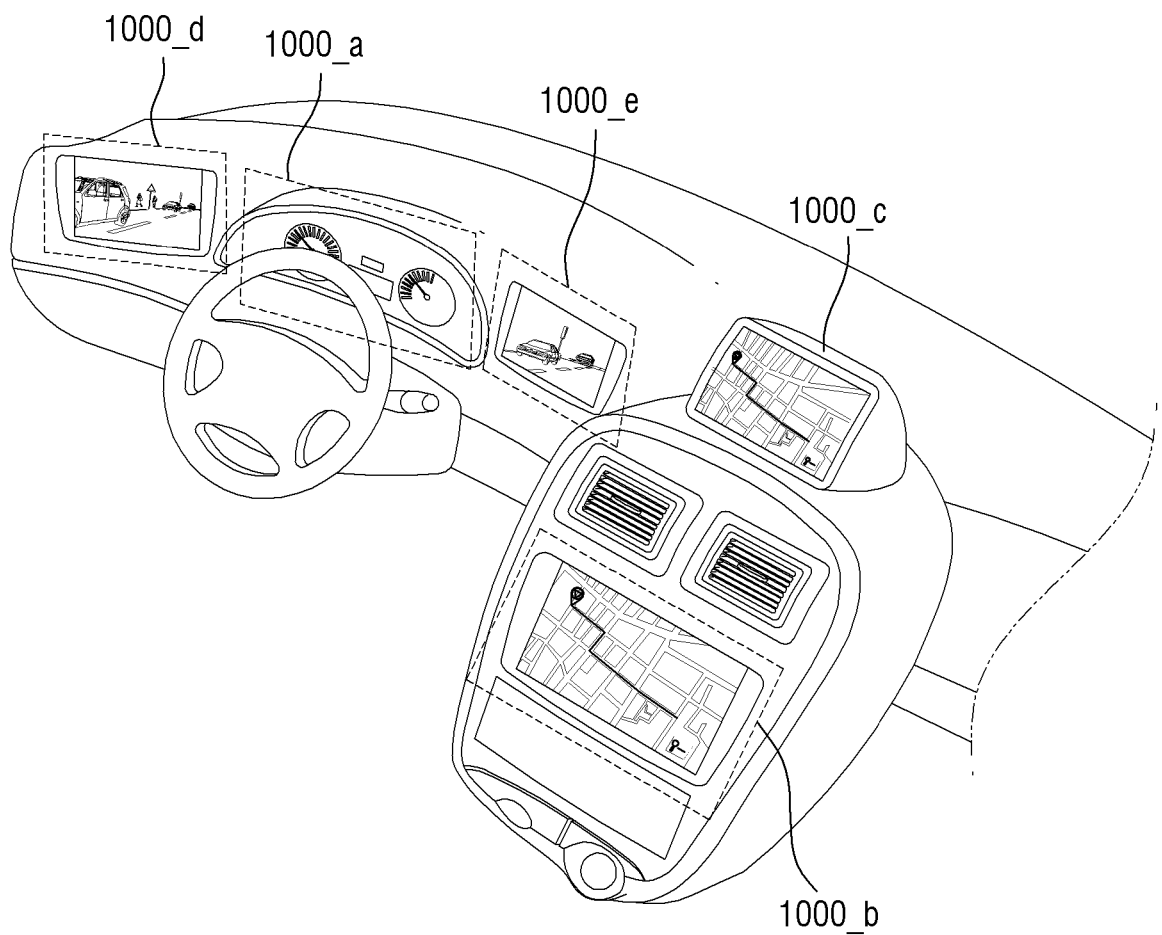
FIG. 29 is a perspective view illustrating a vehicle instrument panel and a center fascia, each including the display device according to one or more embodiments.

FIG. 29 is an example view illustrating a vehicle instrument panel and a center fascia, each including the display device according to one or more embodiments. FIG. 29 illustrates a vehicle to which display devices 1000_a, 1000_b, 1000_c, 1000_d, and 1000_e according to one or more embodiments are applied.

Referring to FIG. 29, the display devices 1000_a, 1000_b, and 1000_c according to one or more embodiments may be applied to an instrument panel of the vehicle, a center fascia of the vehicle, and/or center information displays (CID) positioned on a dashboard of the vehicle. Further, the display devices 1000_d and 1000_e according to one or more embodiments may be applied to rear view mirror displays which replace side mirrors of the vehicle.

Figure 30:
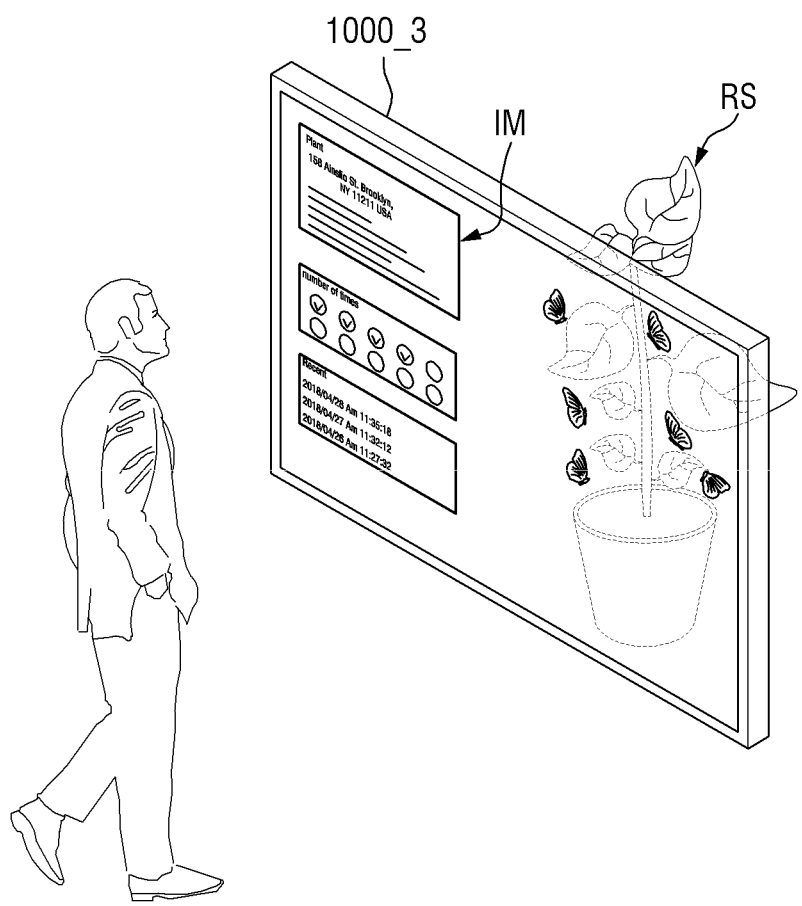
FIG. 30 is a perspective view illustrating a transparent display device including the display device according to one or more embodiments.

FIG. 30 is an example view illustrating a transparent display device including the display device according to one or more embodiments.

Referring to FIG. 30, a display device 1000_3 according to one or more embodiments may be applied to the transparent display device. The transparent display device may transmit light while displaying an image IM. Accordingly, a user located at the front of the transparent display device may not only view the image IM displayed on the display device 1000_3 but also see an object RS or a background located on a rear surface of the transparent display device. When the display device 10003 is applied to the transparent display device, the first substrate (110 in FIG. 5) of the display device 1000_3 may include a light transmitting portion capable of transmitting light or may be formed of a material capable of transmitting light.

In a display device and a method of fabricating the same according to embodiments, defects can be improved when a light emitting element is grown.

Effects according to the embodiments are not limited by the above-described contents, and more various effects are included in the specification.

Although embodiments of the present disclosure have been disclosed for illustrative purposes, those skilled in the art will appreciate that various modifications, additions and substitutions are possible, without departing from the scope and spirit of the present disclosure as disclosed in the accompanying claims and their equivalents.

What is claimed is:

1. A display device comprising:
   a plurality of pixel electrodes on a first substrate and spaced apart from each other;
   a plurality of light emitting elements on the plurality of pixel electrodes; and
   a common electrode layer on the plurality of light emitting elements,
   wherein the common electrode layer comprises a first common electrode layer on the plurality of light emitting elements, and a second common electrode layer between the first common electrode layer and the plurality of light emitting elements, and
   wherein a lattice constant of the first common electrode layer is larger than a lattice constant of the second common electrode layer.

2. The display device of claim 1, wherein each light emitting element of the plurality of light emitting elements comprises a first semiconductor layer coupled to a corresponding pixel electrode of the plurality of pixel electrodes, a second semiconductor layer coupled to the common electrode layer, and an active layer between the first semiconductor layer and the second semiconductor layer.

3. The display device of claim 2, wherein the second semiconductor layer is integrated with the common electrode layer.

4. The display device of claim 2, wherein each light emitting element of the plurality of light emitting elements further comprises an electron blocking layer between the first semiconductor layer and the active layer, and a superlattice layer between the active layer and the second semiconductor layer.

5. The display device of claim 4, further comprising a connection electrode between the first semiconductor layer and the pixel electrode of a corresponding light emitting element.

6. The display device of claim 4, wherein each of the second semiconductor layer and the common electrode layer comprises gallium nitride doped with an n-type dopant (n-GaN).

7. The display device of claim 1, further comprising a third semiconductor layer on the first common electrode layer.

8. The display device of claim 7, wherein the third semiconductor layer comprises a lower undoped semiconductor layer on the first common electrode layer.

9. The display device of claim 8, wherein a lattice constant of the lower undoped semiconductor layer is larger than the lattice constant of the first common electrode layer.

10. The display device of claim 9, wherein the lower undoped semiconductor layer comprises a first sub-semiconductor layer on the second common electrode layer, and a second sub-semiconductor layer having a smaller lattice constant than that of the first sub-semiconductor layer.

11. The display device of claim 9, wherein the lower undoped semiconductor layer comprises porous indium gallium nitride (InGaN).

12. The display device of claim 9, wherein the third semiconductor layer further comprises an upper undoped semiconductor layer on the lower undoped semiconductor layer.

13. The display device of claim 12, wherein the lattice constant of the lower undoped semiconductor layer is larger than a lattice constant of the upper undoped semiconductor layer.

14. The display device of claim 12, wherein the upper undoped semiconductor layer comprises porous gallium nitride (GaN).

15. The display device of claim 7, wherein:
   the third semiconductor layer comprises a lower undoped semiconductor layer on the first common electrode layer, and an upper undoped semiconductor layer on the lower undoped semiconductor layer; and
   a lattice constant of the lower undoped semiconductor layer is smaller than a lattice constant of the upper undoped semiconductor layer.

\* \* \* \* \*